(12) United States Patent
Maeda et al.

(10) Patent No.: US 7,217,622 B2
(45) Date of Patent: May 15, 2007

(54) SEMICONDUCTOR DEVICE AND METHOD OF MANUFACTURING THE SEMICONDUCTOR DEVICE

(75) Inventors: Shigenobu Maeda, Seoul (KR); Young-Wug Kim, Seoul (KR)

(73) Assignee: Samsung Electronics Co., Ltd (KR)

( * ) Notice: Subject to any disclaimer, the term of this patent is extended or adjusted under 35 U.S.C. 154(b) by 58 days.

(21) Appl. No.: 11/024,252

(22) Filed: Dec. 28, 2004

(65) Prior Publication Data

US 2006/0022267 A1    Feb. 2, 2006

(30) Foreign Application Priority Data

Dec. 29, 2003    (KR)    ........................ 10-2003-0098829

(51) Int. Cl.
  *H01L 21/336* (2006.01)
(52) U.S. Cl. ........................ 438/283; 438/283; 438/264; 438/217; 257/E21.433
(58) Field of Classification Search .................... None
  See application file for complete search history.

(56) References Cited

U.S. PATENT DOCUMENTS

| | | | |
|---|---|---|---|
| 5,627,097 A * | 5/1997 | Venkatesan et al. | ........ 438/217 |
| 6,018,179 A * | 1/2000 | Gardner et al. | ............. 257/336 |
| 6,136,655 A * | 10/2000 | Assaderaghi et al. | ....... 438/289 |
| 6,410,938 B1 * | 6/2002 | Xiang | ........................... 257/49 |
| 6,413,857 B1 * | 7/2002 | Subramanian et al. | ....... 438/638 |
| 6,518,130 B1 | 2/2003 | Ohno | ......................... 438/275 |
| 6,586,808 B1 * | 7/2003 | Xiang et al. | ................. 257/407 |

FOREIGN PATENT DOCUMENTS

| | | |
|---|---|---|
| JP | 2001-102545 | 4/2001 |
| KR | 01-8524 | 2/2001 |
| KR | 10-0308652 | 2/2001 |
| KR | 01-39946 | 5/2001 |
| KR | 02-2635 | 1/2002 |

\* cited by examiner

*Primary Examiner*—Michael Lebentritt
*Assistant Examiner*—Kyoung Lee
(74) *Attorney, Agent, or Firm*—Mills & Onello LLP

(57) ABSTRACT

In a method of manufacturing a semiconductor device to improve structural stability of a semiconductor device in a silicidation process, a substrate is provided to have an active region defined by an isolation layer. An etching mask is formed on the active region and the isolation layer to have a silicidation prevention pattern that at least partially exposes the active region. A gate structure is formed on the exposed active region. A gate spacer is formed on a sidewall of the gate structure positioned on the silicidation prevention pattern. Source/drain regions are formed on the active region using the gate spacer as a mask to thereby form the semiconductor device. Since voids may not be generated in a transistor of the semiconductor device or intrusion of the transistor may be prevented in the silicidation process, the semiconductor device including the transistor may have improved reliability and electrical characteristics.

26 Claims, 34 Drawing Sheets

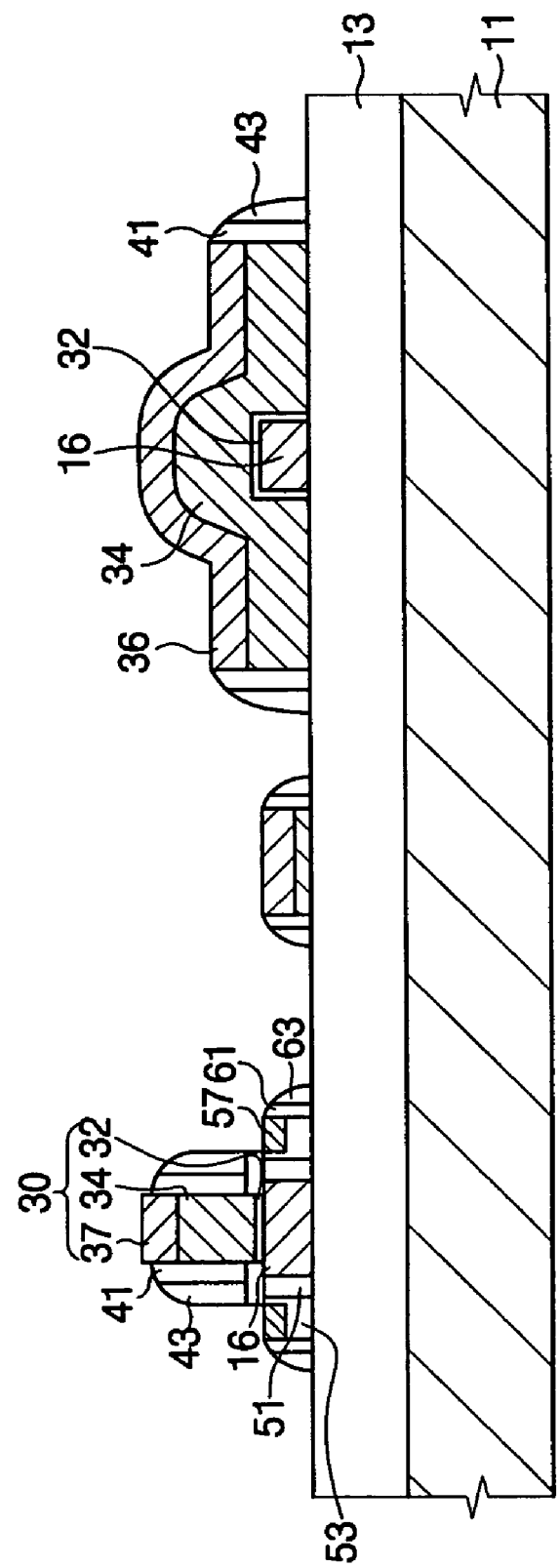

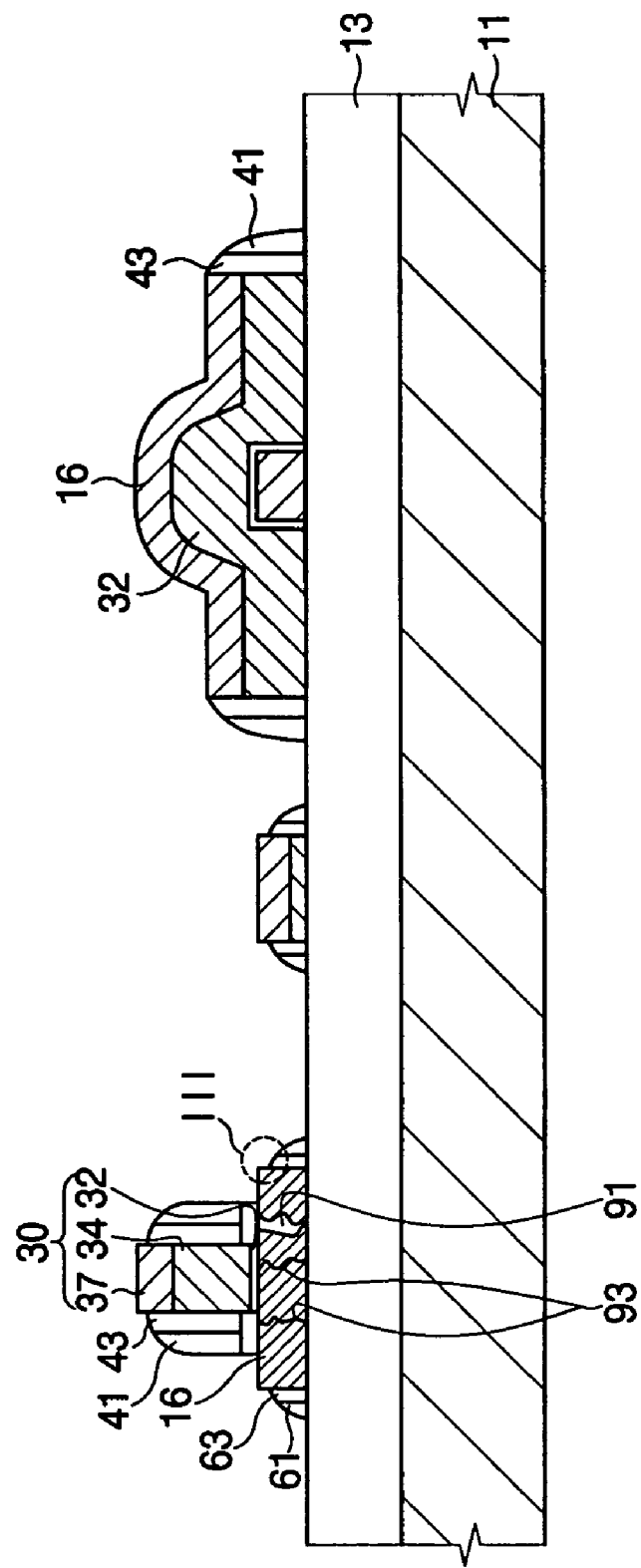

SEMICONDUCTOR DEVICE AND METHOD OF MANUFACTURING THE SEMICONDUCTOR DEVICE

CROSS REFERENCE TO RELATED APPLICATION

This application claims priority under 35 USC § 119 to Korean Patent Application No. 2003-98829, filed on Dec. 29, 2003, the contents of which are incorporated herein by reference in their entirety.

BACKGROUND OF THE INVENTION

1. Field of the Invention

The present invention relates to a semiconductor device and a method of manufacturing the semiconductor device. More particularly, the present invention relates to a semiconductor device having improved structural stability and enhanced performance, and a method of manufacturing the semiconductor device.

2. Description of the Related Art

Semiconductor technology has been rapidly developed to manufacture highly integrated semiconductor devices that have greatly reduced sizes as dimensions of elements in the semiconductor devices have been continuously decreased. Many elements may be integrated in a unit cell of the semiconductor device, and also the semiconductor device may have improved response speed by reducing dimensions of the elements and time delay of a current passing among the elements. In addition, the semiconductor device may have low power consumption by reducing the current passing among the elements.

As the semiconductor device has a minute size, high integration degree and low power consumption, the semiconductor device may have improved performance. Since a transistor having a critical dimension of about 10 μm was developed in 1971, a recent transistor having a critical dimension of about 90 nm is introduced. In recent semiconductor technology, a semiconductor device has been reduced in size, and improved in response speed and integration degree when compared with a conventional semiconductor device. Further, a transistor that has a critical dimension of below about 65 nm is being studied.

However, short channel effect and leakage current may be generated in a semiconductor device including a transistor when the semiconductor device has a critical dimension of below about 90 nm. The short channel effect may be generated in accordance with length reduction of an effective channel of the transistor. The short channel effect is caused by diffusing N type impurities or P type impurities into a source region or a drain region of the transistor during thermal treatment of the transistor. When the effective channel of the transistor is reduced, an electrical short may be generated between the source region and the drain region of the transistor. To solve the above problems, there is provided a transistor having gates formed on three faces of a channel thereof. This transistor is generally referred to as a triple gate transistor. A conventional triple gate transistor is disclosed at Korean Patent No. 308,652 and Korean Patent Laid Open Publication No. 2001-8524.

FIG. 1A is a plan view illustrating a conventional triple gate transistor, and FIG. 1B is a perspective view illustrating the portion of the conventional triple gate transistor labeled "I" in FIG. 1A.

Referring to FIGS. 1A and 1B, the conventional triple gate transistor includes a semiconductor substrate 11, a buried insulation layer 13, a three-dimensional active region 16, and a gate structure 30. The gate structure 30 is formed on the buried insulation layer 13 to enclose the three-dimensional active region 16. That is, channel regions of the triple gate transistor are formed at portions where the gate structure 30 contacts the three-dimensional active region 16. The triple gate transistor may have improved electrical conductivity and prevent the short channel effect so that the triple gate transistor may have a critical dimension of below about 65 nm.

However, when a silicide layer is formed on source/drain regions of the triple gate transistor so as to improve electrical characteristics of the source/drain regions, the silicide layer may be formed on an entire active region as well as on the source/drain regions, thereby reducing the electrical characteristics of the triple gate transistor.

FIGS. 2A to 2C are cross-sectional views illustrating a method of manufacturing the conventional triple gate transistor taken along a line of II–II' in FIG. 1A.

Referring to FIG. 2A, the triple gate transistor includes a semiconductor substrate 11, a buried insulation layer 13, an active region 16 and a gate structure 30. The gate structure 30 includes a gate insulation layer 32, a gate electrode 34, and a gate silicide layer 37.

An offset spacer 41 and a gate sidewall spacer 43 are sequentially formed on a sidewall of the gate structure 30. Source/drain regions 53 are formed in the active region 16, and source/drain extension regions 51 are formed adjacent to the source/drain regions 53. A source/drain offset spacer 61 and a source/drain sidewall spacer 63 are successively formed on a sidewall of the source/drain regions 53.

When a silicide layer 57 is formed on the source/drain regions 53 by siliciding a metal layer after the metal layer is formed on the source/drain regions 53, the silicide layer 57 is positioned on the source/drain regions 53 only because the sidewall of the source/drain regions 53 is covered with the source/drain offset and sidewall spacers 61 and 63.

As shown in FIG. 2B, however, a damaged portion III of the source/drain offset and sidewall spacers 61 and 63 may be generated in processes of manufacturing the triple gate transistor. The source/drain offset and sidewall spacers 61 and 63 including the damaged portion III may not completely protect the sidewall of the source/drain regions 53. Thus, the source/drain regions 53 are partially exposed through the damaged portion III of the source/drain offset and sidewall spacers 61 and 63. As a result, the silicide layer 57 may be formed on the sidewall of the source/drain regions 53 as well as on a surface portion of the source/drain regions 53. That is, a silicidation process of forming the silicide layer 57 may be advanced in directions IV and V relative to the surface and the sidewall of the source/drain regions 53.

Referring to FIG. 2C, a void 91 may be generated in the active region 16 to cause a failure of the triple gate transistor. In addition, silicidation intrusion 93 may be introduced in the source/drain regions 53 to cause damage to a source/drain junction and leakage current from the source/drain regions 53. Therefore, the triple gate transistor including the silicide layer 57 may not be formed when the silicide layer 57 is formed on the source/drain regions 53 using the damaged source/drain offset and sidewall spacers 61 and 63. This problem will be more fully explained with reference to FIGS. 3A and 3B.

FIGS. 3A and 3B are cross-sectional views illustrating a conventional silicidation process.

Referring to FIGS. 3A and 3B, a shrunk source/drain sidewall spacer 63 and a shrunk source/drain offset spacer 61 are sequentially formed on a sidewall of the source/drain regions 53. The sidewalls of the source/drain regions 53 are partially exposed due to the shrunk source/drain sidewall and offset spacers 63 and 61. After a metal layer 58 is formed on the source/drain regions 53 and on the exposed portion of the sidewall of the source/drain regions 53, a silicidation process is performed concerning the source/drain regions 53. As shown in FIGS. 3A and 3B, source/drain regions 53 of a relatively small transistor is entirely converted into a silicide layer 59, whereas most of source/drain regions 53 of a relatively large transistor is converted into a silicide layer 59 near a bottom portion thereof.

In the silicidation process, silicon in the source/drain regions 53 stoichiometrically reacts with metal in the metal layer 58 to thereby form the silicide layer 59. When the silicidation process may not stoichiometrically proceed between silicon and metal, the silicide layer 59 may be formed near channel regions of the triple gate transistor to achieve stoichiometric reaction between silicon and metal. This may result in generation of voids and intrusion of the triple gate transistor. Therefore, a spacer formed on a sidewall of source/drain regions of the triple gate transistor may completely protect the sidewall of the source/drain regions so as to prevent the triple gate transistor from being damaged.

SUMMARY OF THE INVENTION

The present invention provides a semiconductor device including a triple gate transistor that has improved structural stability and enhanced performance without failure caused by a silicidation process.

The present invention also provides a method of manufacturing a semiconductor device including a triple gate transistor that has improved structural stability and enhanced performance without failure caused by a silicidation process.

The present invention further provides a semiconductor device including a silicidation prevention pattern to prevent deterioration of performance and structure thereof.

In accordance with one aspect of the present invention, there is provided a method of manufacturing a semiconductor device. In the method of manufacturing the semiconductor device, a substrate including an active region defined by an isolation layer is formed. An etching mask is formed on the isolation layer and the active region. The etching mask includes a silicidation prevention pattern that exposes a portion of the active region. A gate structure is formed on the exposed portion of the active region, and a gate spacer is formed on the silicidation prevention pattern and a sidewall of the gate structure. Source/drain regions are formed on the active region using the gate spacer as a mask.

In one embodiment, forming the substrate further comprises: forming a silicon nitride layer on a silicon on insulator (SOI) substrate including a lower semiconductor layer, a buried insulation layer and an upper semiconductor layer; forming the active region by at least partially etching the silicon nitride layer and the upper semiconductor layer; forming a first oxide layer on the SOI substrate to cover the active region; exposing the silicon nitride layer pattern by at least partially etching the first oxide layer; and forming the isolation layer by removing the silicon nitride layer.

In one embodiment, the method further comprises forming an additional oxide layer on the SOI substrate before forming the silicon nitride layer, wherein the active region is formed by at least partially etching the silicon nitride layer, the additional oxide layer and the upper semiconductor layer, and the isolation layer is formed by removing the silicon nitride layer and the additional oxide layer.

In one embodiment, the first oxide layer is formed using a high density plasma (HDP) process.

In one embodiment, at least partially etching the first oxide layer further comprises: primarily exposing the silicon nitride layer by polishing the first oxide layer using a chemical mechanical polishing (CMP) process; and secondarily exposing the primarily exposed silicon nitride layer by etching the first oxide layer using a wet etching process with an etching solution including hydrogen fluoride (HF).

In one embodiment, the silicon nitride layer is removed by a wet etching process using an etching solution including phosphoric acid ($H_3PO_4$).

In one embodiment, the silicidation prevention pattern is formed by forming a silicidation prevention layer on the substrate including the isolation layer and the active region; forming a second oxide layer on the silicidation prevention layer; etching the second oxide layer to expose a portion of the silicidation prevention layer; and removing the exposed portion of the silicidation prevention layer to form the silicidation prevention pattern at least partially exposing the active region.

The method can further include forming a silicon oxide pattern on the isolation layer and the active region to at least partially expose the active region before forming the silicidation prevention pattern, wherein the silicidation prevention pattern is formed on the silicon oxide pattern.

In one embodiment, the etching mask further comprises an oxide layer pattern formed on the silicidation prevention pattern, and forming the gate structure further comprises forming a gate conductive layer on the oxide pattern and the exposed portion of the active region; exposing the oxide layer pattern by at least partially removing the gate conductive layer; and forming the gate structure by removing the oxide layer pattern.

In one embodiment, the method further comprises, prior to forming the gate spacer, forming an offset spacer on the sidewall of the gate structure; and forming source/drain extension regions by implanting impurities into portions of the active region using the offset spacer as a mask, wherein the gate spacer is formed on a sidewall of the offset spacer.

In one embodiment, the method further comprises, after forming the source/drain regions, at least partially exposing the source/drain regions and the isolation layer by removing a portion of the silicidation prevention pattern around the gate spacer; and forming silicidation layers on the source/drain regions.

In one embodiment, the silicidation layers are formed at surface portions of the source/drain regions.

In one embodiment, the method further comprises, after forming the etching mask, at least partially etching the active region to form a recess on the active region; and forming an additional gate spacer on a sidewall of the recess of the active region, wherein the gate structure is formed on the recess of the active region.

In accordance with another aspect of the present invention, there is provided a method of manufacturing a semiconductor device. In the method of manufacturing the semiconductor device, an SOI substrate including a lower semiconductor layer, a buried insulation layer and an upper semiconductor layer is formed. Active regions are formed by at least partially etching the upper semiconductor layer and forming an isolation layer on the buried insulation layer. An etching mask is formed on the isolation layer and the active regions. The etching mask includes a silicidation prevention pattern and a first oxide layer pattern that partially and fully exposes the active regions. A portion of the buried insulation layer is exposed around the fully exposed active region by at least partially removing the etching mask. Gate structures are formed on the at least partially exposed active region and the fully exposed active region. Gate spacers are formed on sidewalls of the gate structures, and source/drain regions are formed on the active regions using the gate spacer as masks.

In one embodiment, the gate structure encloses the fully exposed active region.

In one embodiment, channel regions are formed on an upper portion and lateral portions of the active region.

In one embodiment, the method further comprises, after forming the source/drain regions, at least partially exposing the source/drain regions and the isolation layer by at least partially removing the silicidation prevention pattern; and forming silicidation layers on the exposed source/drain regions.

In one embodiment, the method further comprises, after forming the etching mask, at least partially etching the partially exposed active region using the etching mask; and forming an additional gate spacer from an etched portion of the active region to a sidewall of the etching mask, wherein the gate structure is positioned on the etched portion of the active region.

In accordance with still another aspect of the present invention, there is provided a method of manufacturing a semiconductor device. In the method of manufacturing the semiconductor device, a substrate including a semiconductor layer pattern defined by an isolation layer is formed. An etching mask is formed on the isolation layer and the semiconductor layer pattern. The etching mask includes an oxide layer pattern and a silicidation prevention pattern at least partially exposing the semiconductor layer pattern. A three-dimensional active region having a polygonal structure is formed by at least partially etching the oxide layer pattern. A gate structure is formed on the substrate to enclose the active region. A gate spacer is formed on a sidewall of the gate structure, and source/drain regions are formed on the active region using the gate spacer as a mask.

In one embodiment, channel regions are formed on an upper portion and lateral portions of the active region.

In one embodiment, the method further comprises, after forming the source/drain regions, at least partially exposing the source/drain regions and the isolation layer by at least partially removing the silicidation prevention pattern; and forming silicide layers on exposed portions of the source/drain regions.

In accordance with still another aspect of the present invention, there is provided a method of manufacturing a semiconductor device. In the method of manufacturing the semiconductor device, a substrate including a lower semiconductor layer, a buried insulation layer and upper semiconductor layer patterns is formed. An etching stop layer is formed on the substrate to cover the upper semiconductor layer patterns. Active regions are formed on the buried insulation layer by forming an isolation layer on the etching stop layer. An etching mask is formed on the isolation layer and the active regions. The etching mask includes a silicidation prevention pattern and an oxide layer pattern that at least partially and fully exposes the active regions. A portion of the etching stop layer is exposed around the fully exposed active region by at least partially removing the etching mask. A portion of the buried insulation layer is exposed around the fully exposed active region by at least partially removing the etching stop layer. Gate structures are formed on the at least partially exposed active region and the fully exposed active region. Gate spacers are formed on sidewalls of the gate structures, and source/drain regions are formed on the active regions using the gate spacer as masks.

In one embodiment, forming the active regions further comprises forming a silicon nitride layer pattern on the etching stop layer; forming an oxide layer on the etching stop layer to cover the silicon nitride layer pattern; exposing a portion of the etching stop layer and the silicon nitride layer pattern by at least partially etching the oxide layer; and forming the active region defined by the isolation layer and the etching stop layer by successively removing the exposed portion of the etching stop layer and the silicon nitride layer pattern.

In one embodiment, the etching stop layer includes silicon nitride.

In one embodiment, the method further comprises successively forming an additional oxide layer pattern and nitride layer pattern on the upper semiconductor layer patterns.

In accordance with still another aspect of the present invention, there is provided a semiconductor device including a substrate, a gate structure, a silicidation prevention pattern and a gate spacer. The substrate includes an isolation layer and an active region defined by the isolation layer. The gate structure is formed on the active region, and the silicidation prevention pattern is formed on a portion of the active region adjacent to the gate structure. The gate spacer is formed on a sidewall of the gate structure.

In one embodiment, the isolation layer has a thickness thicker than a thickness of the active region.

In one embodiment, the semiconductor device further comprises a silicide layer formed on a portion of the active region adjacent to the silicidation prevention pattern.

In one embodiment, the substrate includes an SOI substrate having a lower semiconductor substrate, a buried insulation layer and an upper semiconductor layer, and the active region is formed by at least partially etching the upper semiconductor layer.

In one embodiment, the gate structure includes a gate insulation layer pattern formed on the active region and a gate conductive pattern formed on the gate insulation layer pattern.

In one embodiment, the gate structure further includes a silicide layer formed on the gate conductive pattern.

In one embodiment, the silicidation prevention pattern includes thermally deposited silicon nitride or silicon nitride deposited by a plasma process.

In one embodiment, the semiconductor device further comprises a silicon oxide layer pattern formed between the active region and the silicidation prevention pattern.

In one embodiment, the gate spacer includes material having an etching selectivity relative to the silicidation prevention pattern.

In one embodiment, the gate spacer has a single-layered structure including oxide or nitride or a multi-layered structure including oxide and nitride.

In one embodiment, the semiconductor device further comprises an offset spacer formed between the gate spacer and the sidewall of the gate structure.

In one embodiment, the active region includes source/drain regions formed thereon and source/drain extension regions formed between the gate spacer and the source/drain regions.

In one embodiment, the active region includes a recess, and the gate structure is positioned on the recess.

In one embodiment, the semiconductor device of claim 38, further comprising an additional spacer formed between the gate spacer and the sidewall of the gate structure.

In accordance with still another aspect of the present invention, there is provided a semiconductor device including an SOI substrate, a gate structure, a silicidation prevention pattern and a gate spacer. The SOI substrate includes a lower semiconductor layer, a buried insulation layer and a three-dimensional active region having a polygonal structure formed on the buried insulation layer. The gate structure is formed on the buried insulation layer. The gate structure encloses the active region. The silicidation prevention pattern is formed on a portion of the active region adjacent to the gate structure. The gate spacer is formed on a sidewall of the gate structure.

In one embodiment, the semiconductor device further comprises channel regions formed on an upper portion and lateral portions of the active region.

In one embodiment, the semiconductor device further comprises a silicide layer formed on a portion of the active region adjacent to the silicidation prevention pattern.

In one embodiment, the active region includes a recess, and the gate structure is formed on the recess.

In one embodiment, the semiconductor device further comprises an additional gate spacer formed between the sidewall of the gate structure and the gate spacer.

According to the present invention, a semiconductor device may include a triple gate transistor that has improved electrical characteristics without generation of voids and intrusion thereof. Thus, the semiconductor device including the triple gate transistor may have enhanced performance and reliability. Additionally, a failure such as thermal budget of the semiconductor device may be prevented in a step of forming silicidation prevention patterns of the semiconductor device because the silicidation prevention patterns are formed before forming source/drain regions of the semiconductor device.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

FIGS. 2A to 2C are schematic cross-sectional views illustrating a method of manufacturing the conventional triple gate transistor taken along a line of II–II' in FIG. 1A.

DESCRIPTION OF THE INVENTION

Figure 1A:
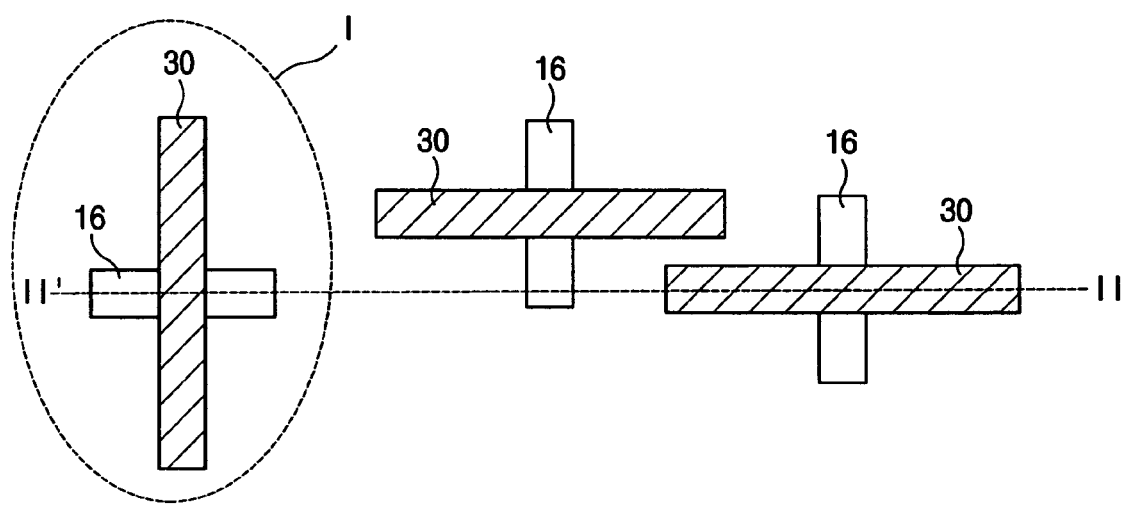
FIG. 1A is a schematic plan view illustrating a conventional triple gate transistor.
Figure 1B:
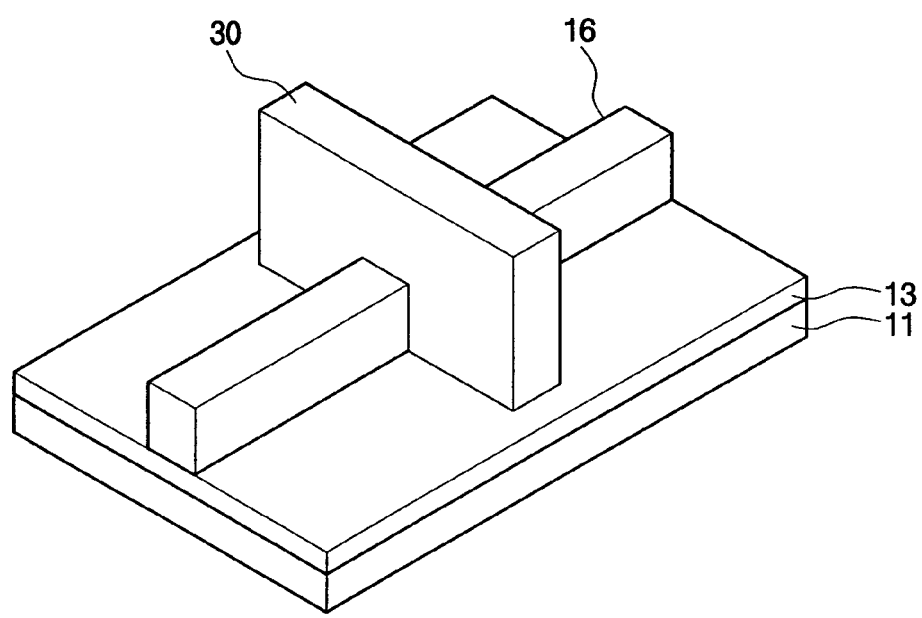
FIG. 1B is a schematic perspective view illustrating a portion of the conventional triple gate transistor in FIG. 1A labeled "I".
Figure 2B:
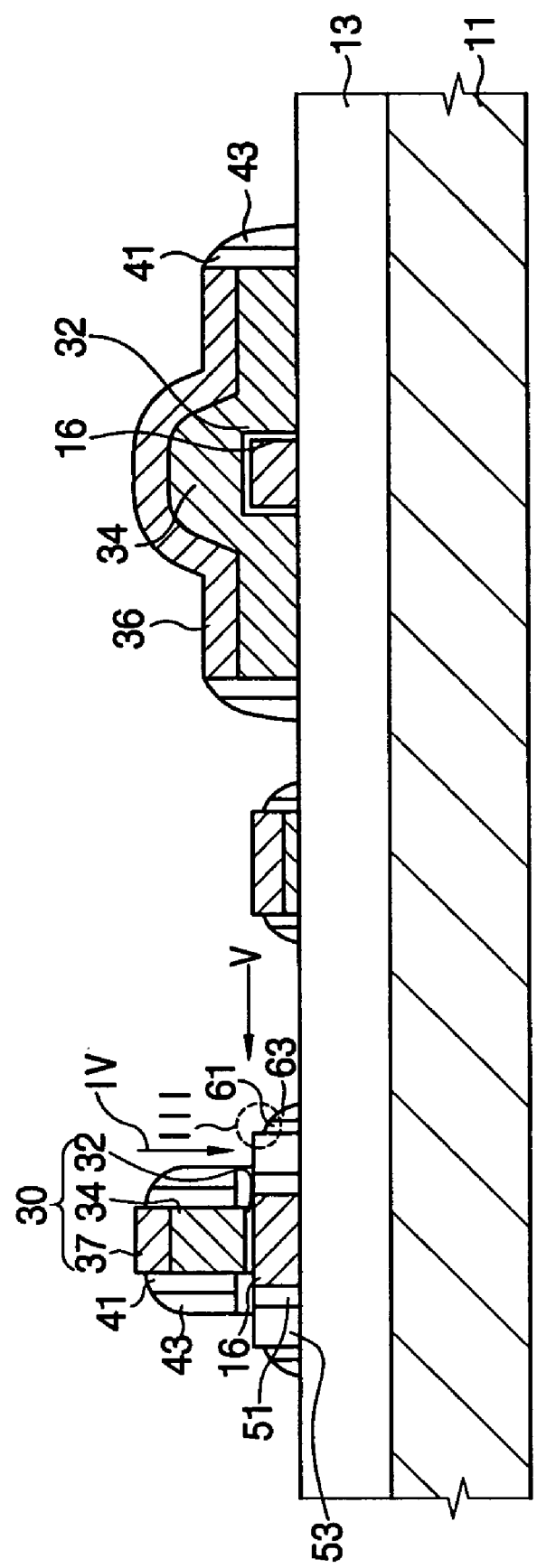
Figure 3A:
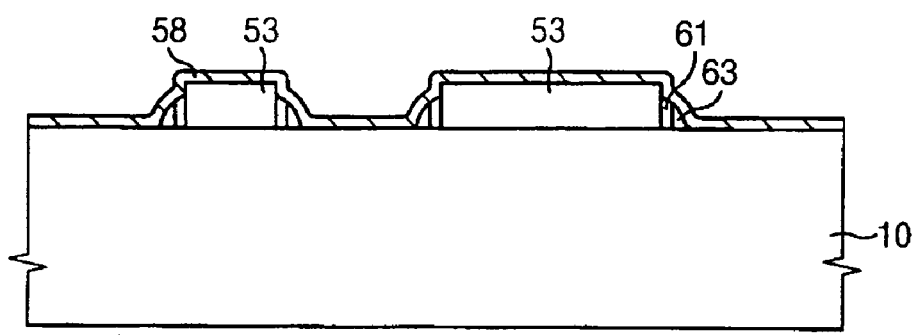
FIGS. 3A and 3B are schematic cross-sectional views illustrating a conventional silicidation process.
Figure 3B:
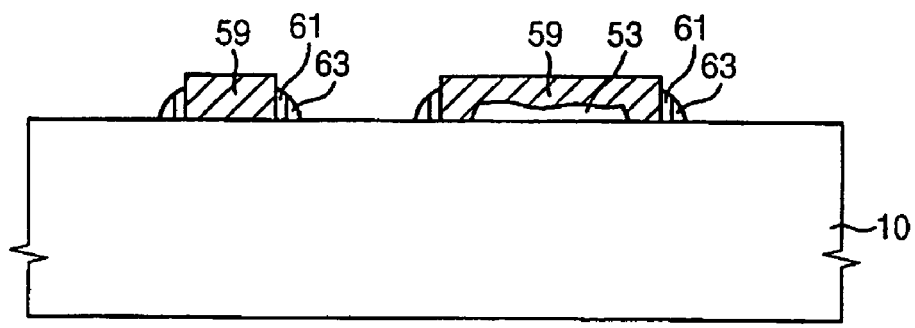

In the drawings, the thicknesses of layers and regions are exaggerated for clarity. It will be understood that when an element such as a layer, region or substrate is referred to as-being "on" or "onto" another element, it can be directly on the other element or intervening elements may also be present.

Figure 4:
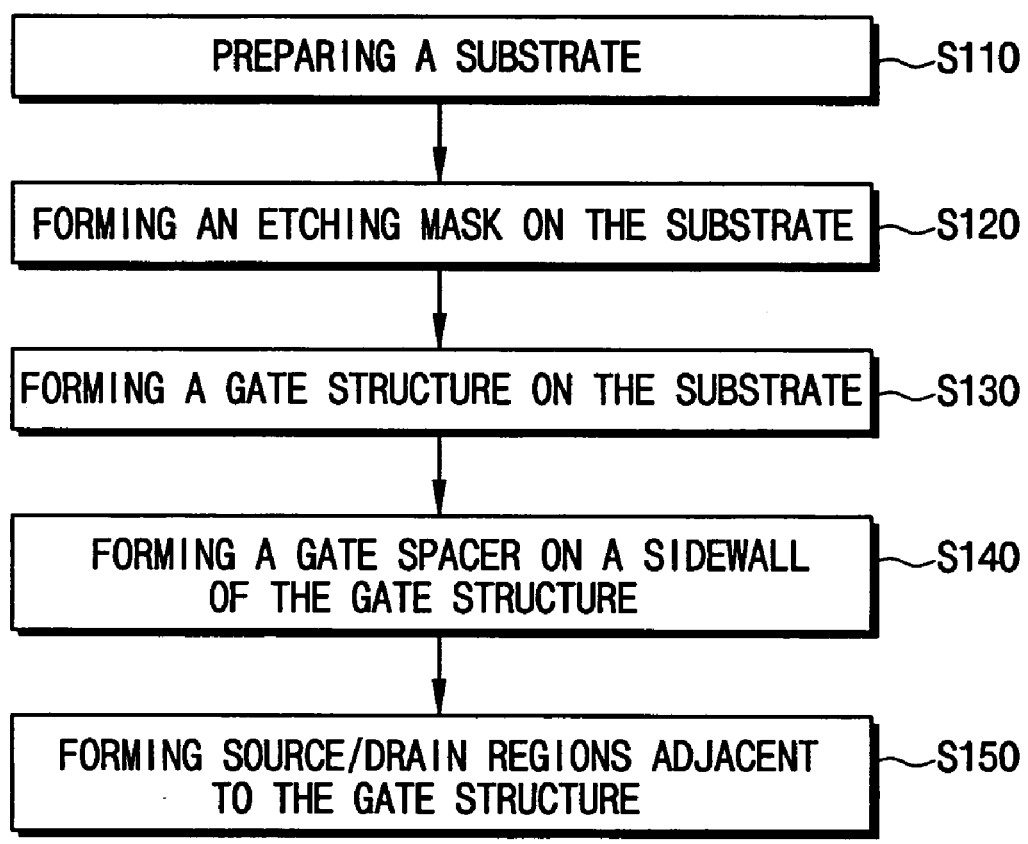
FIG. 4 is a flow chart illustrating a method of manufacturing a semiconductor device in accordance with one embodiment of the present invention.

FIG. 4 is a flow chart illustrating a method of manufacturing a semiconductor device in accordance with one embodiment of the present invention.

Referring to FIG. 4, after a semiconductor substrate including an isolation layer and an active region defined by the isolation layer is prepared in step S110, an etching mask is formed on the semiconductor substrate in step S120. The etching mask includes a silicidation prevention pattern that partially exposes the active region of the semiconductor substrate.

In step S130, a gate structure is formed on the exposed portion of the active region. A gate spacer is formed on a sidewall of the gate structure positioned on the silicidation prevention pattern in step 140.

In step S150, source/drain regions are formed in the active region adjacent to the gate structure by an ion implantation process using the gate spacer as a mask.

Hereinafter, the method of manufacturing a semiconductor device will be described more fully with reference to FIGS. 5A to 5P.

Figure 5A:
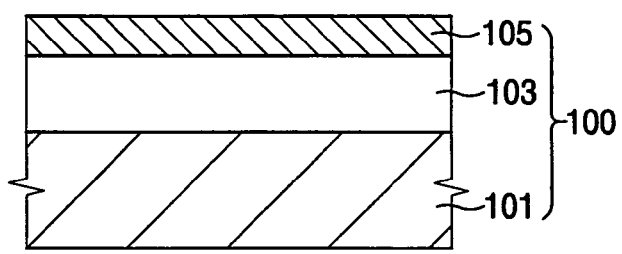
FIGS. 5A to 5P are schematic cross-sectional views illustrating a method of manufacturing a semiconductor device in accordance with one embodiment of the present invention.
Figure 5B:
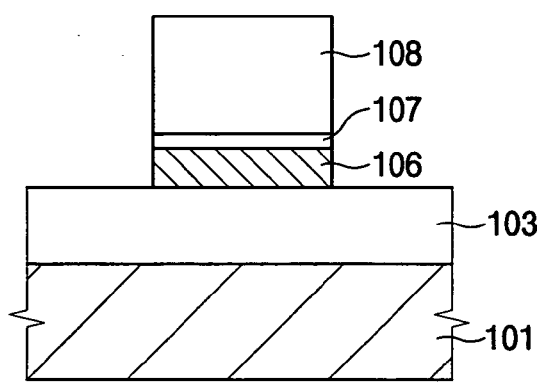
Figure 5C:
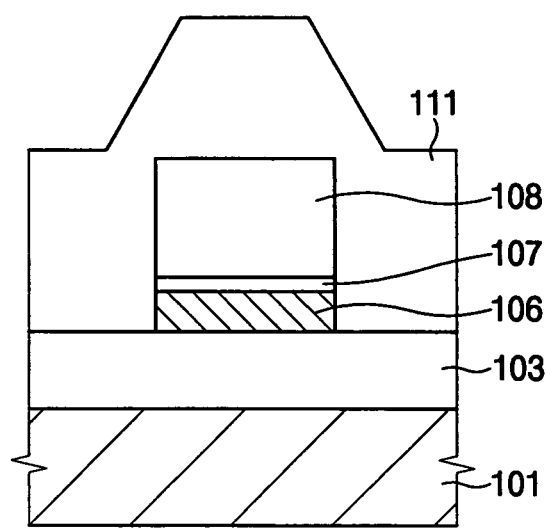
Figure 5D:
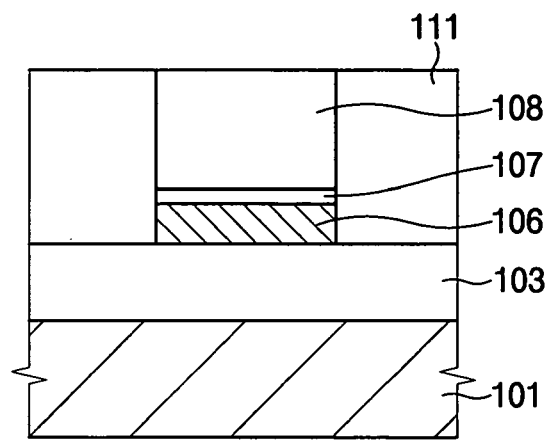
Figure 5E:
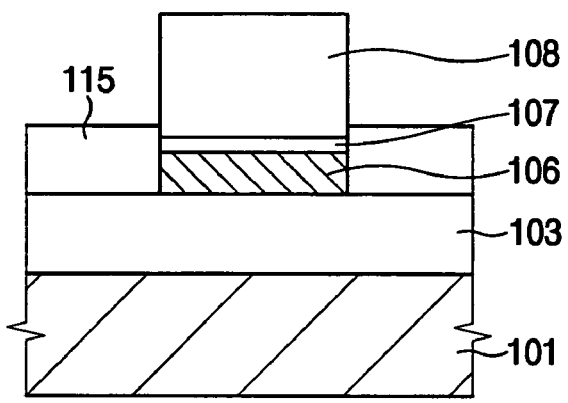
Figure 5F:
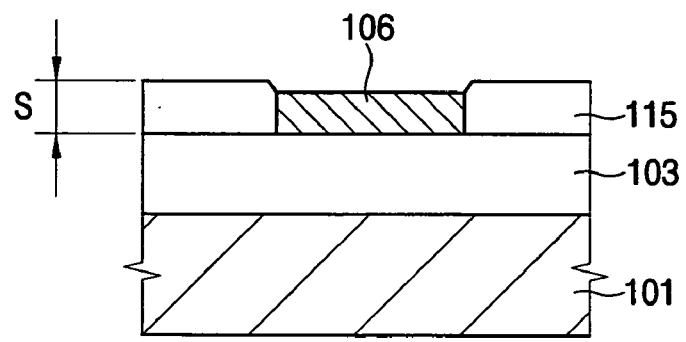
Figure 5G:
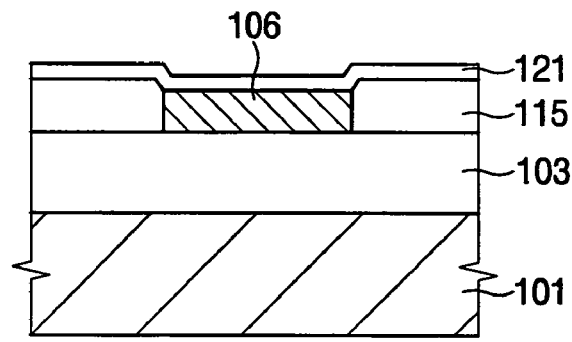
Figure 5H:
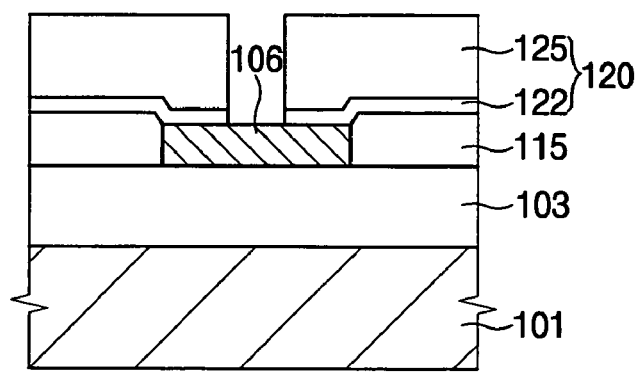
Figure 5I:
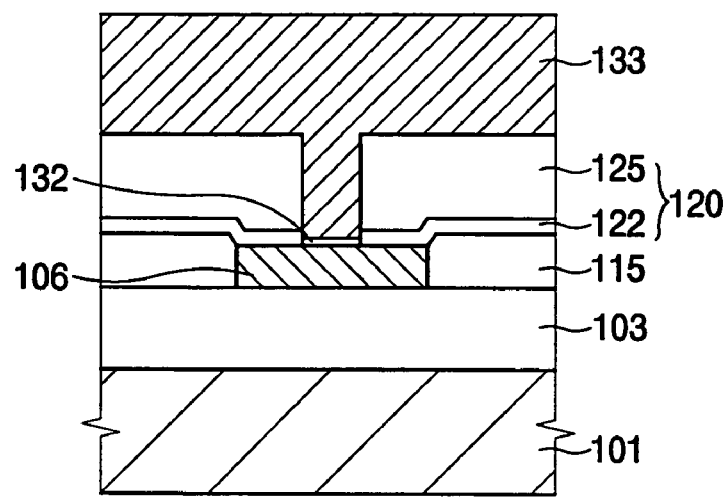
Figure 5J:
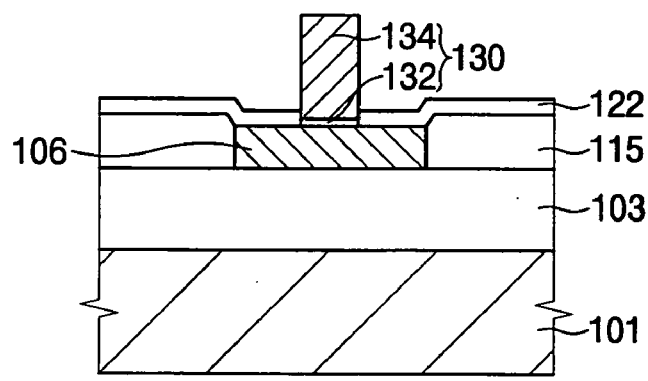
Figure 5K:
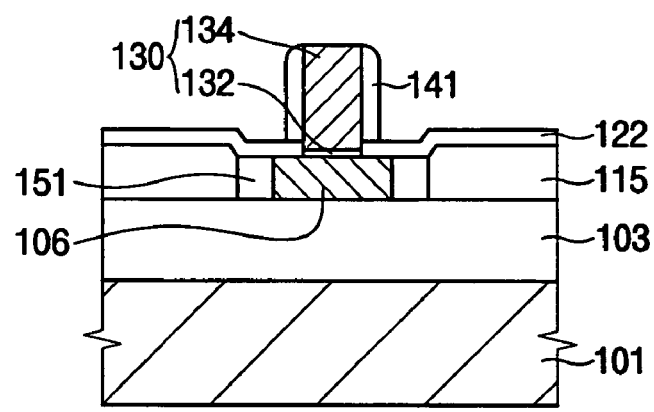
Figure 5L:
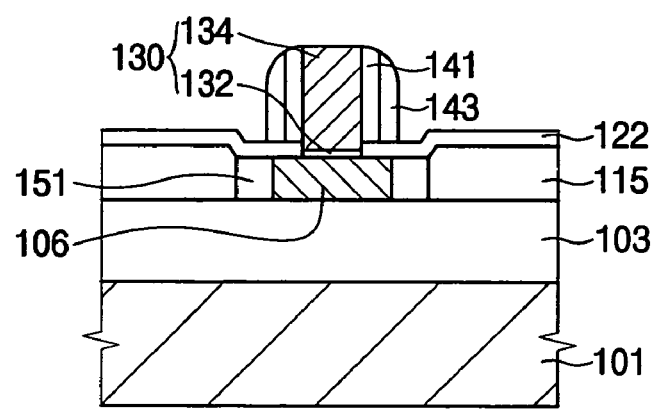
Figure 5M:
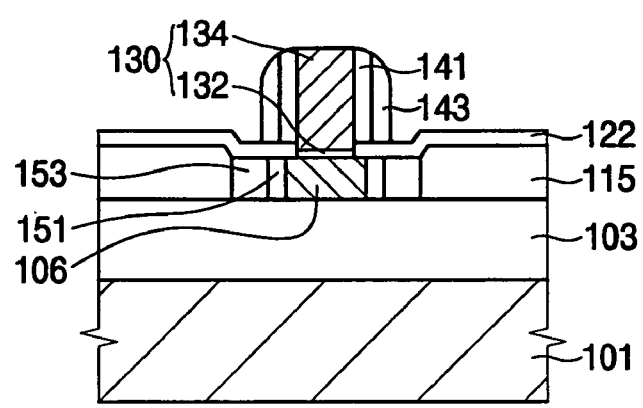
Figure 5N:
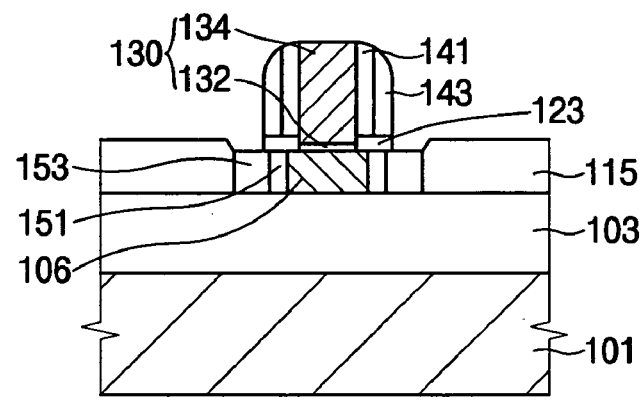
Figure 5O:
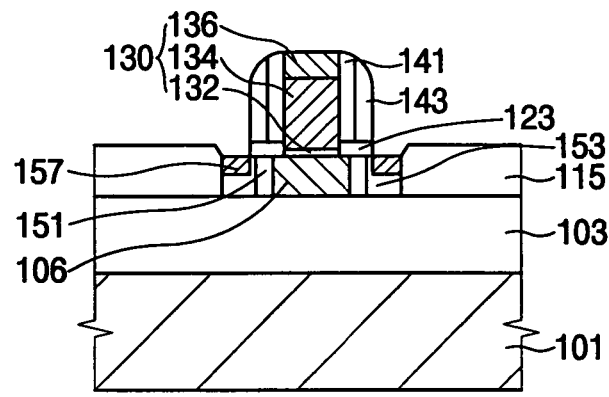
Figure 5P:
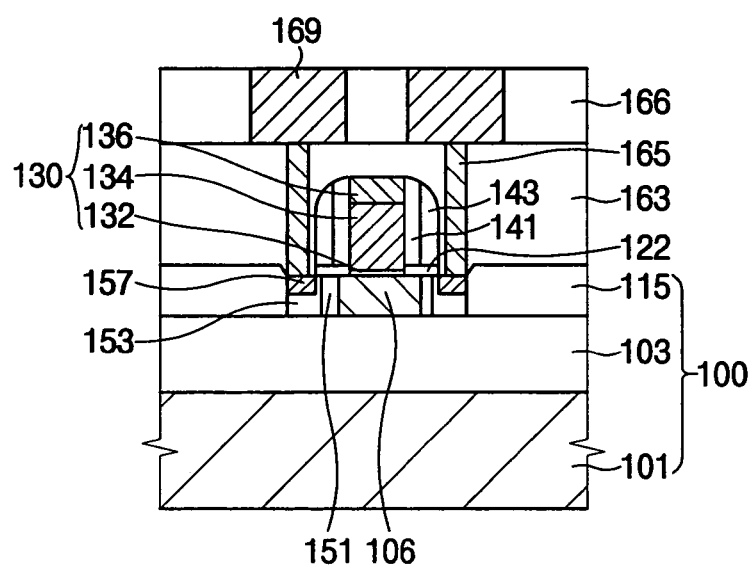

FIGS. 5A to 5P are cross-sectional views illustrating a method of manufacturing a semiconductor device in accordance with one embodiment of the present invention.

Referring to FIGS. 5A, 5B and 5F, a semiconductor substrate 100 is prepared to have an active region 106 defined by an isolation layer 115. The semiconductor substrate 100 may include a silicon substrate or a silicon on insulator (SOI) substrate. The SOI substrate is preferably prepared as the semiconductor substrate 100 as shown in FIG. 5A.

Referring to FIG. 5A, the semiconductor substrate 100 includes a lower semiconductor layer 101, a buried insulation layer 103 and an upper semiconductor layer 105. The buried insulation layer 103 is formed on the lower semiconductor layer 101, and the upper semiconductor layer 105 is formed on the buried insulation layer 103. For example, the buried insulation layer 103 has a thickness of about 150 nm, and the upper semiconductor layer 105 has a thickness of about 40 nm.

Referring to FIG. 5B, after a silicon nitride layer is formed on the semiconductor substrate 100, the silicon nitride layer and the upper semiconductor layer 105 are partially etched to form the active region 106 on the buried insulation layer 103. After an etching process for forming the active region 106, a portion of the upper semiconductor layer pattern remains on the buried insulation layer 103. The remaining portion of the upper semiconductor layer corresponds to the active region 106. Additionally, the silicon nitride layer is etched to form a silicon nitride layer pattern 108 on the active region 106.

In one embodiment of the present invention, an additional oxide layer pattern 107 may be formed between the active region 106 and the silicon nitride layer pattern 108. In particular, an additional oxide layer is formed on the upper semiconductor layer 105 before forming the silicon nitride layer on the upper semiconductor layer 105. After the silicon nitride layer is formed on the additional oxide layer, the silicon nitride layer, the additional oxide layer and the upper semiconductor layer 105 are successively etched to form the silicon nitride layer pattern 108, the additional oxide layer pattern 107 and the active region 106, respectively. As a result, the active region 106, the additional oxide layer pattern 107 and the silicon nitride layer pattern 108 are sequentially formed on the buried insulation layer 103. For example, the silicon nitride layer pattern 108 has a thickness of about 100 nm, and the additional oxide layer pattern 107 has a thickness of about 15 nm. The additional oxide layer pattern 107 serves as a buffer layer pattern for reducing stress generated in the silicon nitride layer in the step of forming the silicon nitride layer. The additional oxide layer pattern 107 may be formed by a thermal oxidation process, or a chemical vapor deposition (CVD) process.

Referring to FIG. 5C, a first oxide layer 111 is formed on the semiconductor substrate 100 to cover the active region 106 and the silicon nitride layer pattern 108. The first oxide layer 111 may be formed by a high density plasma (HDP) process. For example, the first oxide layer 111 has a thickness of about 200 nm.

Referring to FIG. 5D, a portion of the first oxide layer 111 is primarily removed to expose the silicon nitride layer pattern 108. Here, an upper portion of the first oxide layer 111 may be removed by a chemical mechanical polishing (CMP) process, an etch back process or a combination process of a CMP and an etch back. Preferably, the first oxide layer 111 is partially removed by the CMP process until the silicon nitride layer pattern 108 is exposed. As a result, an upper face of the silicon nitride layer pattern 108 is exposed, and also the first oxide layer 111 and the silicon nitride layer pattern 108 are planarized together.

Referring to FIG. 5E, a portion of the first oxide layer 111 is secondarily removed to primarily form the isolation layer 115 that defines the active region 106 on the buried insulation layer 103. When the isolation layer 115 is initially formed on the buried insulation layer 103, the silicon nitride layer pattern 108 is protruded from the isolation layer 115. For example, the portion of the first oxide layer 111 is secondarily removed by a wet etching process or a dry etching process. Preferably, the first oxide layer 111 is secondarily removed by the wet etching process using an etching solution including hydrogen fluoride (HF). The first oxide layer 111 is secondarily removed so that the isolation layer 115 has a thickness thicker than that of the active region 106 from the buried insulation layer 103.

Referring to FIG. 5F, the silicon nitride layer pattern 108 and the additional oxide layer pattern 107 are removed to completely form the semiconductor substrate 100 that has the active region 106 defined by the isolation layer 115. The silicon nitride layer pattern 108 and the additional oxide layer pattern 107 may be removed by a wet etching process or a dry etching process. Preferably, the silicon nitride layer pattern 108 and the additional oxide layer pattern 107 are removed by the wet etching process using an etching solution including hot phosphoric acid ($H_3PO_4$). Then, impurities are implanted into portions of the active region 106 to form channel regions of a semiconductor device including a transistor. That is, the channel regions of the semiconductor device may be formed by an ion implanting process. As shown in FIG. 5F, the isolation layer 115 has a thickness S slightly thicker than that of the active region 106 so that the isolation layer 115 prevents silicidation of a sidewall of the active region 106 in a subsequent silicidation process.

Referring to FIGS. 5G and 5H, an etching mask 120 is formed on the isolation layer 115 and on the active region 106 to partially expose the active region 106. That is, a peripheral portion of the active region 106 is covered with the etching mask 120, whereas a central portion of the active region 106 is exposed through the etching mask 120. Here, the etching mask 120 includes a silicidation prevention layer pattern 122 and a second oxide layer pattern 125.

As shown in FIG. 5G, a silicidation prevention layer 121 is formed on the isolation layer 115 and on the active region 106. The silicidation prevention layer 121 may be formed using nitride such as silicon nitride. For example, the silicidation prevention layer 121 has a thickness of about 10 nm. The silicidation prevention layer 121 prevents damage to the isolation layer 115 generated in a successive wet or dry etching process. As a result, the silicidation of the sidewall of the active region 106 is effectively prevented in the subsequent silicidation process because the isolation layer 115 completely protects the sidewall of the active region 106.

In one embodiment of the present invention, an additional silicon oxide layer (not shown) may be formed on the isolation layer 115 and on the active region 106 before forming the silicidation prevention layer 121. When the silicidation prevention layer 121 is formed using silicon nitride, the additional silicon oxide layer serves as a buffer layer to reduce stress generated in the silicidation prevention layer 121. For example, the additional silicon oxide layer is formed by a CVD process.

As shown in FIG. 5H, a second oxide layer is formed on the silicidation prevention layer 121. The second oxide layer may have a thickness of about 100 nm. After the second oxide layer is partially etched to form the second oxide layer pattern 125 that exposes a portion of the silicidation prevention layer 121. The exposed portion of the silicidation prevention layer 121 is removed to form the silicidation prevention layer pattern 122 that exposes the central portion of the active region 106. The second oxide layer and the silicidation prevention layer 121 are etched by a wet etching process or a dry etching process, thereby forming the second oxide layer pattern 125 and the silicidation prevention layer pattern 122. Hence, the central portion of the active region 106 is exposed through the second oxide layer pattern 125 and the silicidation prevention layer pattern 122. Preferably, the second oxide layer and the silicidation prevention layer 121 are etched by a photolithography process. A gate structure 130 (see FIG. 5J) will be formed on the exposed portion of the active region 106.

Referring to FIG. 5I, after a gate insulation layer pattern 132 is formed on the exposed portion of the active region 106, a gate conductive layer 133 is formed on the gate insulation layer pattern 132 and the etching mask 120. The gate insulation layer pattern 132 may be formed using oxide, nitride or oxynitride. The gate conductive layer 133 may be formed using conductive material such polysilicon or metal. For example, when the gate insulation layer pattern 132 is formed using silicon oxynitride (SiON), the gate insulation layer pattern 132 has a thickness of about 0.5 to about 2.0 nm. Alternatively, the gate insulation layer pattern 132 may be formed using material having a high dielectric constant.

Referring to FIG. 5J, the gate conductive layer 133 is partially removed to expose the second oxide layer pattern 125 by a CMP process, an etch back process, or a combination process of a CMP and an etch back. Then, the second oxide layer pattern 125 is removed to form the gate structure 130 on the active region 106. When the second oxide layer 125 is removed, the silicidation prevention layer pattern 122 is exposed. The gate structure 130 includes a gate conductive pattern 134 and the gate insulation layer pattern 132. The second oxide layer pattern 125 may be removed by a wet etching process using an etching solution including hydrogen fluoride. Since the silicidation prevention layer pattern 122 is formed to cover the isolation layer 115, the isolation layer 115 may not be damaged in the wet etching process using the etching solution including hydrogen fluoride. Hence, in the subsequent silicidation process, silicidation of the sidewall of the active region 106 is prevented because the undamaged isolation layer 115 covers the sidewall of the active region 106.

Referring to FIGS. 5K and 5L, a gate spacer 143 is formed on a sidewall of the gate structure 130. Alternatively, an offset spacer 141 may be formed on the sidewall of the gate structure 130 before forming the gate spacer 143. When the offset spacer 141 is formed on the sidewall of the gate structure 130, the gate spacer 143 is positioned on the offset spacer 141. In one embodiment of the present invention, source/drain extension regions 151 may be formed adjacent to the active region 106 before forming the gate spacer 143 on the sidewall of the gate structure 130.

As shown in FIG. 5K, the offset spacer 141 is formed on the sidewall of the gate structure 130 before forming the gate spacer 143. Here, a bottom portion of the offset spacer 141 is positioned on the silicidation prevention layer pattern 122. The gate spacer 143 is formed on the offset spacer 141. A bottom portion of the gate spacer 143 is positioned on the silicidation prevention layer pattern 122 when the offset spacer 141 is formed on the sidewall of the gate structure 130. Alternatively, when the gate spacer 143 may be directly formed on the sidewall of the gate structure 130, the bottom portion of the gate spacer 143 is positioned on the silicidation prevention layer pattern 122 without forming the offset spacer 141 on the sidewall of the gate structure 130. The source/drain extension regions 151 may be formed by implanting impurities into portions of the active region 106 using the offset spacer 141 as a mask. That is, portions of the active region 106 may be converted into the source/drain extension regions 151 by implanting the impurities into the portions of the active region 106.

The offset spacer 141 may be formed using oxide and/or nitride. That is, the offset spacer 141 may have a single-layered structure of oxide or a double-layered structure of oxide and nitride. For example, the offset spacer 141 has a thickness of about 5 to about 20 nm. In particular, a layer for the offset spacer 141 is formed on the silicidation prevention layer pattern 122 to cover the gate structure 130. The layer for the offset spacer 141 is etched by a dry etching process using the silicidation prevention layer pattern 122 as an etching stop layer, thereby forming the offset spacer 141 on the sidewall of the gate structure 130. Here, the offset spacer 141 is formed using material that has etching selectivity relative to the silicidation prevention layer pattern 122.

To form the offset spacer 141 having the double-layered structure of oxide and nitride, an oxide layer and a nitride layer are successively formed on the silicidation prevention layer pattern 122 to cover the gate structure 130. The nitride layer is etched using the oxide layer as an etching stop layer, and then the oxide layer is etched using the silicidation prevention layer pattern 122 as an etching stop layer, thereby forming the offset spacer 141 having the double-layered structure on the sidewall of the gate structure 130.

The source/drain extension regions 151 are formed by implanting N type or P type impurities into the portions of the active region 106 using the offset spacer 141 as the mask. Further, halo regions may be selectively formed under the source/drain extension regions 151 by a slant implantation process. The halo regions may be formed using N type and P type impurities under the P type and N type source/drain extension regions 151, respectively. The halo regions may reduce a short channel effect of a semiconductor device including a transistor, and also improve electrical characteristics of the semiconductor device.

Referring to FIG. 5L, the gate spacer 143 is formed on the offset spacer 141 and on the silicidation prevention layer pattern 122. For example, the gate spacer 143 has a thickness of about 10 to about 70 nm. The gate spacer 143 may be formed in accordance with a process substantially identical to the above-described process for forming the offset spacer 141. The gate spacer 143 may have a single-layered structure of oxide or a double-layered structure of oxide and nitride. The gate spacer 143 is formed using a material having etching selectivity relative to the silicidation prevention layer pattern 122.

Referring to FIG. 5M, source/drain regions 153 are formed at portions of the active region 106 by implanting impurities using the gate spacer 143 as a mask. The source/drain regions 153 are adjacent to the source/drain extension regions 151, respectively. That is, the source/drain regions 153 are formed between the source/drain extension regions 151 and the isolation layer 115.

Referring to FIG. 5N, the silicidation prevention layer pattern 122 is partially removed until the isolation layer 115 is exposed to thereby form silicidation prevention patterns 123 beneath the gate spacer 143 and the offset spacer 141. Here, the source/drain regions 153 are partially exposed between the isolation layer 115 and the silicidation prevention patterns 123. The silicidation prevention patterns 123 are positioned beneath the gate spacer 143 and the offset spacer 141 only, whereas the silicidation prevention patterns 123 cover portions of the source/rain regions 153, the source/drain extension regions 151 and portions of the active region 106. That is, the silicidation prevention patterns 123 partially cover the source/drain regions 153. In one embodiment of the present invention, the silicidation prevention patterns 123 may further remain on the isolation layer 115 to which the subsequent silicidation process is not performed, thereby reducing processing time and cost for manufacturing the semiconductor device including the transistor.

Referring to FIG. 5O, the silicidation process is carried out about the exposed portions of the source/drain regions 153 to form silicidation layers 136 and 157 on the exposed portions of the source/drain regions 153 and on the gate conductive pattern 134, respectively. Particularly, since the isolation layer 115 has a height slightly higher than that of the active region 106, the silicidation layer 157 is formed on the source/drain regions 153 besides sidewalls of the source/drain regions 153. Accordingly, the silicidation layer 157 is uniformly formed on surface portions of the source/drain regions 153 except lateral portions and bottom portions of the source/drain regions 153. As a result, voids or intrusion may not be generated in the source/drain regions 153 to thereby reduce a failure of the semiconductor device such as leakage current. In addition, stress generated in the process of forming the silicidation prevention patterns 123 may be advantageously employed in order to improve the characteristics of the semiconductor device including a P-MOS transistor or an N-MOS transistor. That is, when the silicidation prevention pattern 123 includes silicon nitride deposited by a thermal process, tensile stress may be generated in the N-MOS transistor and also electron mobility of the N-MOS transistor may be enhanced, thereby improving electrical characteristics of the N-MOS transistor. When the silicidation prevention pattern 123 includes silicon nitride deposited by a plasma process, compressive stress may be generated in the P-MOS transistor and hole mobility of the P-MOS transistor may be improved, thereby enhancing electrical characteristics of the P-MOS transistor.

Referring to FIG. 5P, a first insulating interlayer 163, contact plugs 165, a second insulating interlayer 166, and a metal wiring 169 may be formed on the semiconductor substrate 101 where the gate structure 130 and the source/drain regions 153 are formed, thereby completing the semiconductor device including the transistor.

Figure 6A:
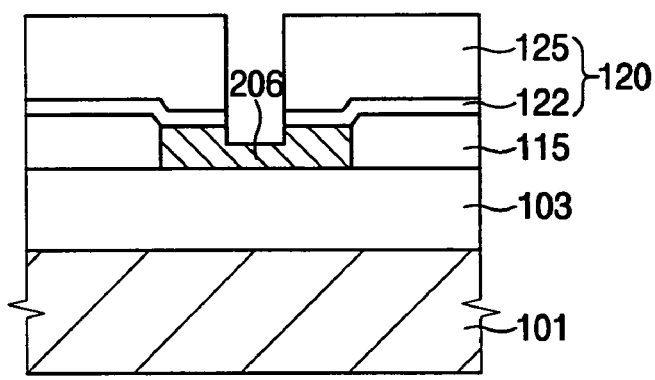
FIGS. 6A to 6C are schematic cross-sectional views illustrating a method of manufacturing a semiconductor device in accordance with one embodiment of the present invention.
Figure 6B:
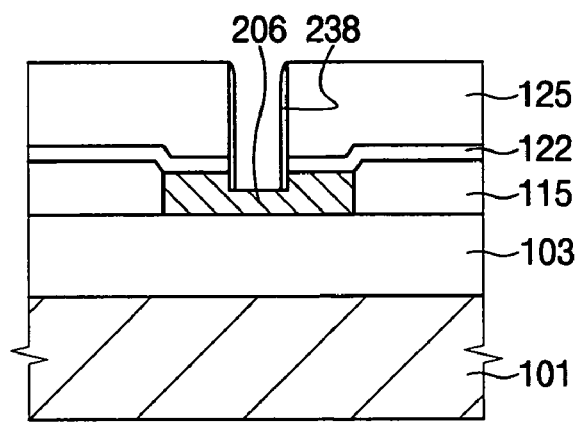
Figure 6C:
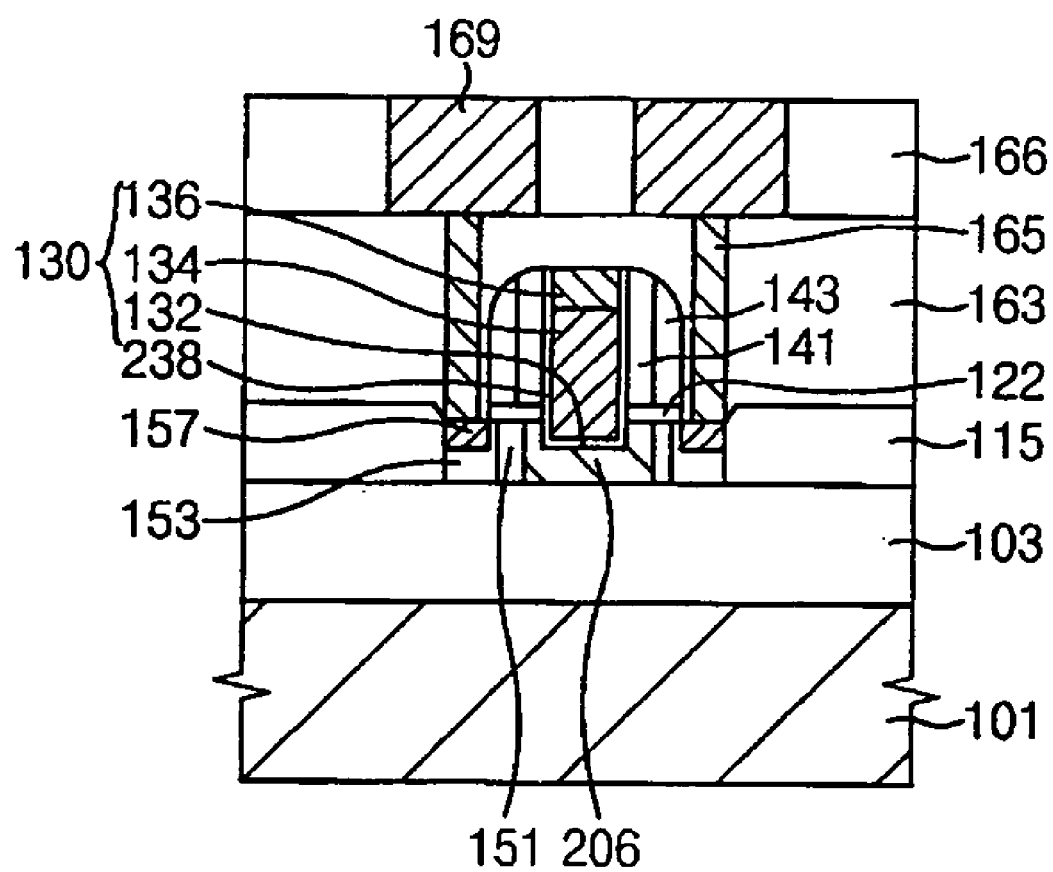

FIGS. 6A to 6C are cross-sectional views illustrating a method of manufacturing a semiconductor device in accordance with another embodiment of the present invention.

Referring to FIG. 6A, an active region 206 is formed on a semiconductor substrate 100 and exposed through the etching mask 120 by processes substantially identical to the processes described with reference to FIGS. 5A to 5H. Namely, a central portion of the active region 206 is exposed through the etching mask 120 including a second oxide layer pattern 125 and a silicidation prevention layer pattern 122. Then, the exposed portion of the active region 206 is partially etched using the etching mask 120 to thereby form a recess at the central portion of the active region 206.

Referring to FIG. 6B, an additional gate spacer 238 is formed from a sidewall of the recess to a sidewall of the etching mask 120. That is, the additional gate spacer 238 is formed on the sidewall of the recess of the active region 206, on a sidewall of the silicidation prevention layer pattern 122, and on a sidewall of the second oxide layer pattern 125. The additional gate spacer 238 may be formed using dielectric material such as oxide or nitride. When the additional gate spacer 238 is formed on the sidewall of the recess of the active region 206, gate overlap capacitance of a semiconductor device may be reduced.

Referring to FIG. 6C, a gate structure 130 is formed on the semiconductor substrate 100 by processes substantially identical to the processes described with reference to FIGS. 5I to 5L. Then, the semiconductor device including a transistor is formed on the semiconductor substrate 100 by processes substantially identical to the processes described with reference to FIGS. 5M to 5P.

When the additional gate spacer 238 is formed as shown in FIG. 6B, the gate structure 130 is positioned on the recess of the active region 206. Here, most of the additional gate spacer 238 is interposed between the gate conductive pattern 134 and an offset spacer 141, whereas an upper portion of the additional gate spacer 238 is positioned between a silicidation layer 136 and the offset spacer 141. Thus, three spacers 238, 141 and 143 are formed on a sidewall of the gate structure 130. In the present embodiment, the semiconductor device including the transistor may have thin channel regions and thick source/drain regions so that the transistor may have improved characteristics as described above.

Referring now to FIG. 6C, a first insulating interlayer 163, contact plugs 165, a second insulating interlayer 166, and a metal wiring 169 may be sequentially formed on the semiconductor substrate 101 where the gate structure 130 and the source/drain regions 153 are formed, thereby completing the semiconductor device including the transistor.

Figure 7:
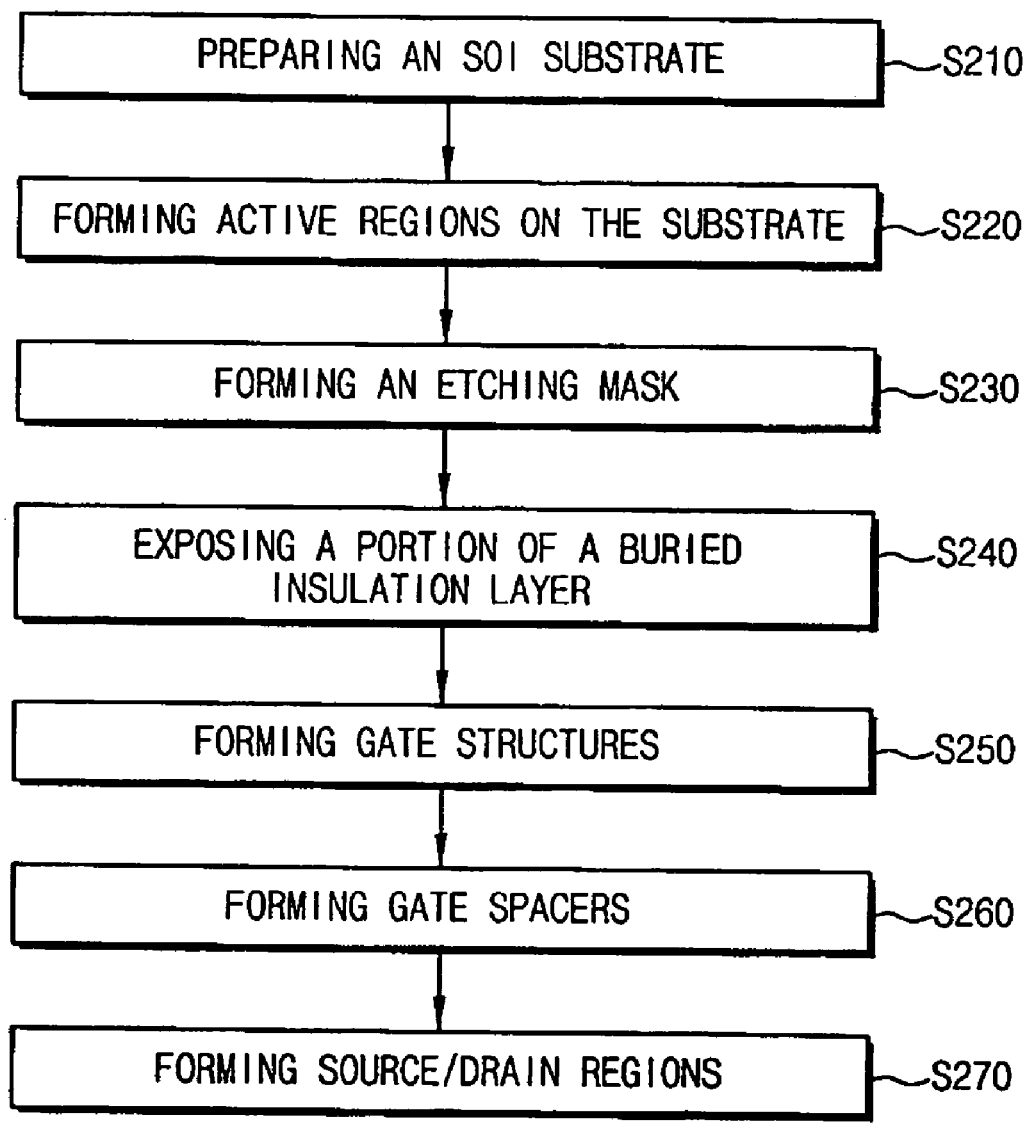
FIG. 7 is a flow chart illustrating a method of manufacturing a semiconductor device including a triple gate transistor in accordance with one embodiment of the present invention.

FIG. 7 is a flow chart illustrating a method of manufacturing a semiconductor device including a triple gate transistor in accordance with one embodiment of the present invention.

Referring to FIG. 7, after an SOI substrate is prepared in step S210, active regions are defined on the SOI substrate in step S220. An etching mask partially or fully exposing the active regions is formed on the SOI substrate in step S230. The etching mask includes a silicidation prevention layer pattern and an oxide layer pattern.

In step S240, a portion of the oxide layer pattern crossing the fully exposed active region is removed to expose a portion of a buried insulation layer of the SOI substrate. Gate structures are formed on the partially exposed active region and on the exposed portion of the buried insulation layer so as to enclose the fully exposed active region in step S250.

In step S260, gate spacers are formed at sidewalls of the gate structures, respectively. In step S270, a semiconductor device including a triple gate transistor is formed on the SOI substrate by forming source/drain regions at the active regions using the gate spacers as masks.

FIGS. 8A to 8D are cross-sectional views illustrating a method of manufacturing a semiconductor device including a triple gate transistor in accordance with another embodiment of the present invention.

Figure 8A:
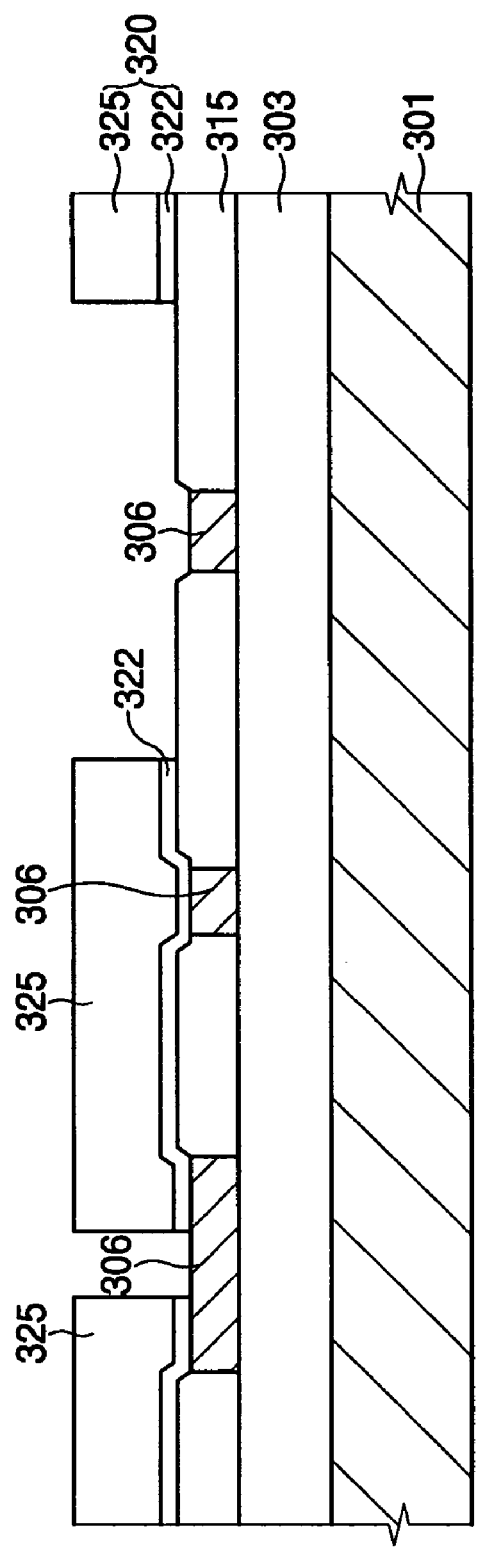
FIGS. 8A to 8D are schematic cross-sectional views illustrating a method of manufacturing a semiconductor device including a triple gate transistor in accordance with one embodiment of the present invention.

Referring to FIG. 8A, an SOI substrate is prepared by a process substantially identical to the above-described process. The SOI substrate includes a lower semiconductor layer 301, a buried insulation layer 303 formed on the lower semiconductor layer 301, and an upper semiconductor layer positioned on the buried insulation layer 303.

When an isolation layer 315 is formed on the buried insulation layer 303, active regions 306 are defined from the upper semiconductor layer by processes substantially identical to the processes described with reference to FIGS. 5A to 5F.

An etching mask 320 is formed on the isolation layer 315 and on the active regions 306. The etching mask 320 includes a silicidation prevention layer pattern 322 and an oxide layer pattern 325. The etching mask 320 partially and fully exposes the active regions 306 or the etching mask 320 covers the active region 306. That is, a central portion of one active region 306 is exposed through the etching mask 320, another active region 306 is covered with the etching mask 320, and the other active region 306 is fully exposed through the etching mask 320. Here, a portion of the isolation layer 315 around the fully exposed active region 306 is also exposed through the etching mask 320.

Figure 8B:
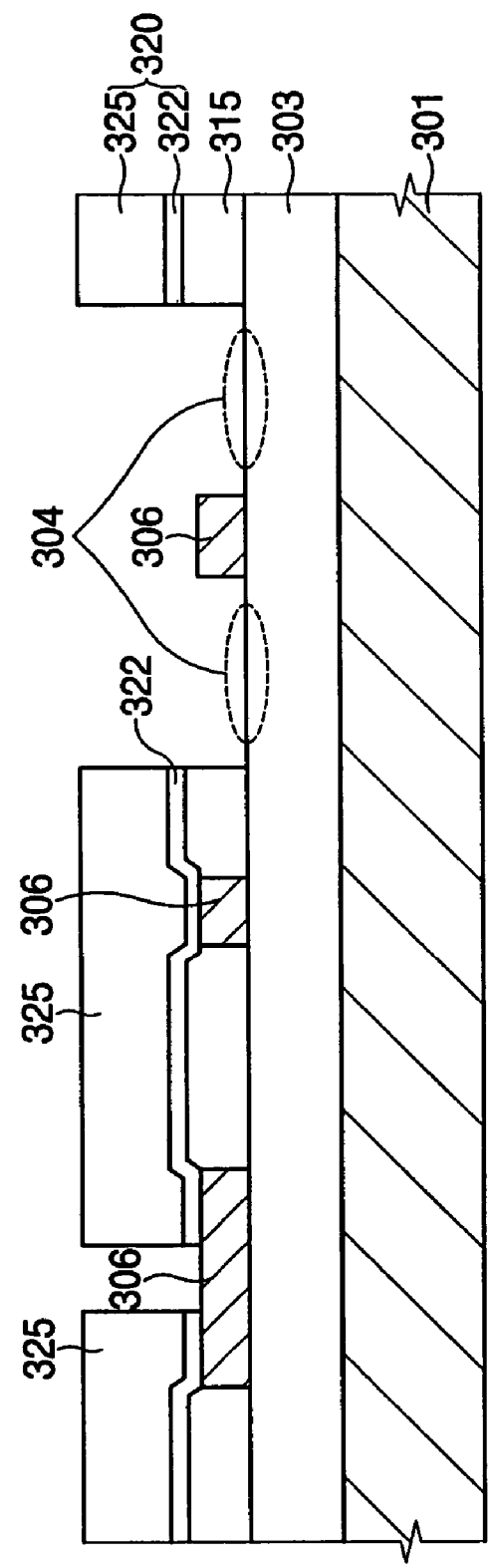

Referring to FIG. 8B, the portion of the isolation layer 315 around the fully exposed active region 306 is removed using the etching mask 320, thereby exposing a portion 304 of the buried insulation layer 303 around the fully exposed active region 306. Here, the portion of the isolation layer 315 around the fully exposed active region 306 is etched without damage to the exposed portion 304 of the buried insulation layer 303. In addition, when the isolation layer 315 is partially etched, the oxide layer pattern 325 is partially etched. Hence, the oxide layer pattern 325 is properly controlled to have sufficient thickness so that the oxide layer pattern 325 remains on the isolation layer 315 and on the fully exposed active regions 306, whereas the portion 304 of the buried insulation layer 303 is exposed. As a result, the fully exposed active region 306 may have a three-dimensional structure, and also channel regions of a triple gate transistor may be formed at lateral portions and an upper portion of the fully exposed active region 306, thereby forming the triple gate transistor on the SOI substrate.

Figure 8C:
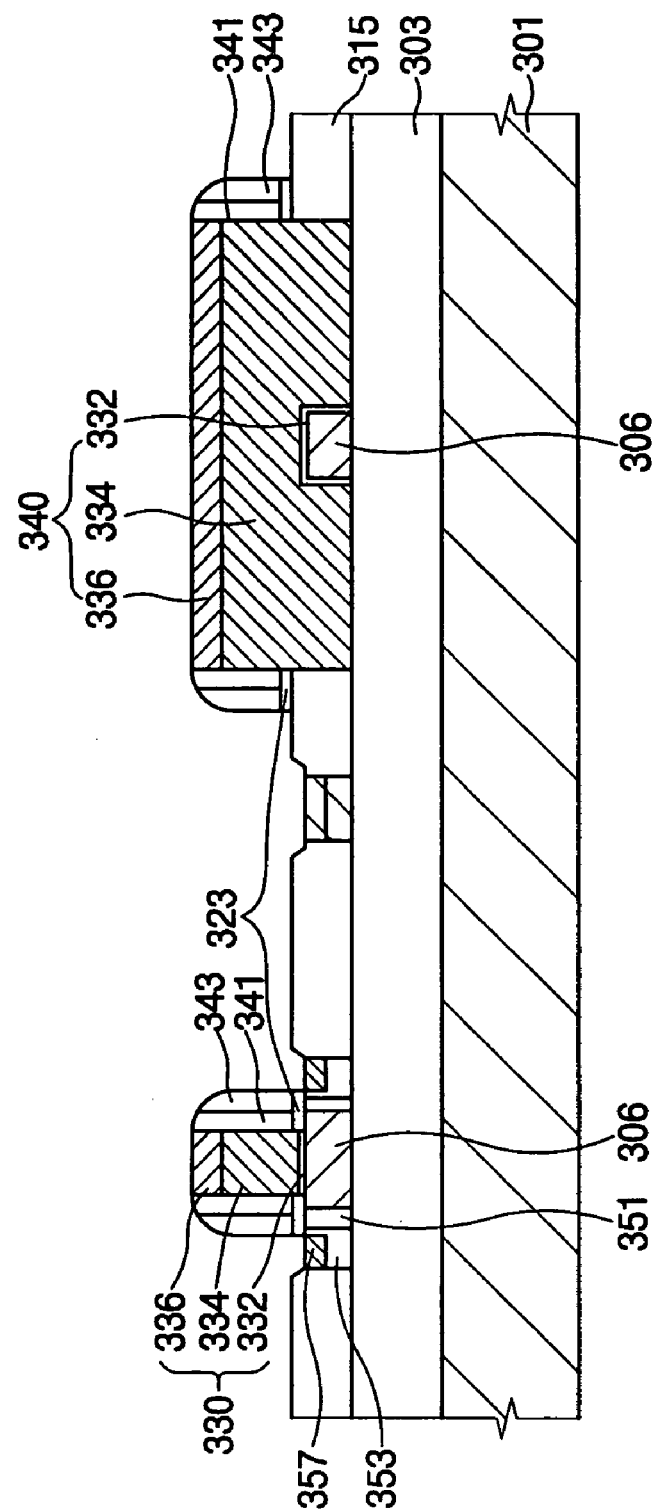

Referring to FIG. 8C, gate structures 330 and 340 are formed on the partially and fully exposed active regions 306, respectively. The gate structure 340 positioned on the exposed portion of the buried insulation layer 303 encloses the fully exposed active region 306. The gate structure 330 formed on the partially exposed active region 306 includes a gate oxide layer pattern 332, a gate conductive pattern 334 and a silicidation layer 336. The gate structure 340 enclosing the fully exposed active region 306 includes a gate oxide layer pattern 332, a gate conductive pattern 334 and a silicidation layer 336. Thus, the triple gate transistor including the channel regions formed at lateral and upper portions of the fully exposed active region 306 is formed on the SOI substrate because the gate structure 340 encloses the lateral and upper portions of the fully exposed active region 306.

Gate spacers 343 are formed on sidewalls of the gate structures 330 and 340, respectively. Alternatively, offset spacers 341 may be formed on the sidewalls of the gate structures 330 and 340 before forming the gate spacers 343. When the offset spacers 341 are formed on the sidewall of the gate structures 330 and 340, the offset spacers 341 are interposed between the gate spacers 343 and the sidewalls of the gate structures 330 and 340. Source/drain extension regions 351 may be formed by implanting impurities into portions of the active regions 306 using the offset spacers 341 as masks.

Source/drain regions 353 are formed at portions of the active regions 306 adjacent to the gate structures 330 and 340 by implanting impurities using the gate spacers 343 as masks. The source/drain extension regions 351 are interposed between the source/drain regions 353 and the active region 306 when the source/drain extension regions 351 are formed. Portions of the silicidation prevention layer pattern 322 may be removed to form silicidation prevention patterns 323 that expose portions of the source/drain regions 353 and the isolation layer 315. Then, silicidation layers 357 and 336 are formed at portions of the source/drain regions 353 and the gate conductive patterns 334 by a silicidation process. The silicidation process is executed about the exposed portions of the source/drain regions 353 and gate conductive patterns 334 to thereby form the silicidation layers 357 and 336 on the exposed portion of the source/drain regions 353 and on the gate conductive patterns 334, respectively. In particular, since the isolation layer 315 has height slightly higher than those of the active regions 306, the silicidation layers 357 are formed on upper portions of the source/drain regions 353 beside sidewalls of the source/drain regions 353. That is, the silicidation layer 357 is formed on surface portions of the source/drain regions 353 except lateral portions and bottom portions of the source/drain regions 353. As a result, voids or intrusion may not be generated in the source/drain regions 353, thereby reducing a failure of the semiconductor device including the triple gate transistor such as leakage current.

Figure 8D:
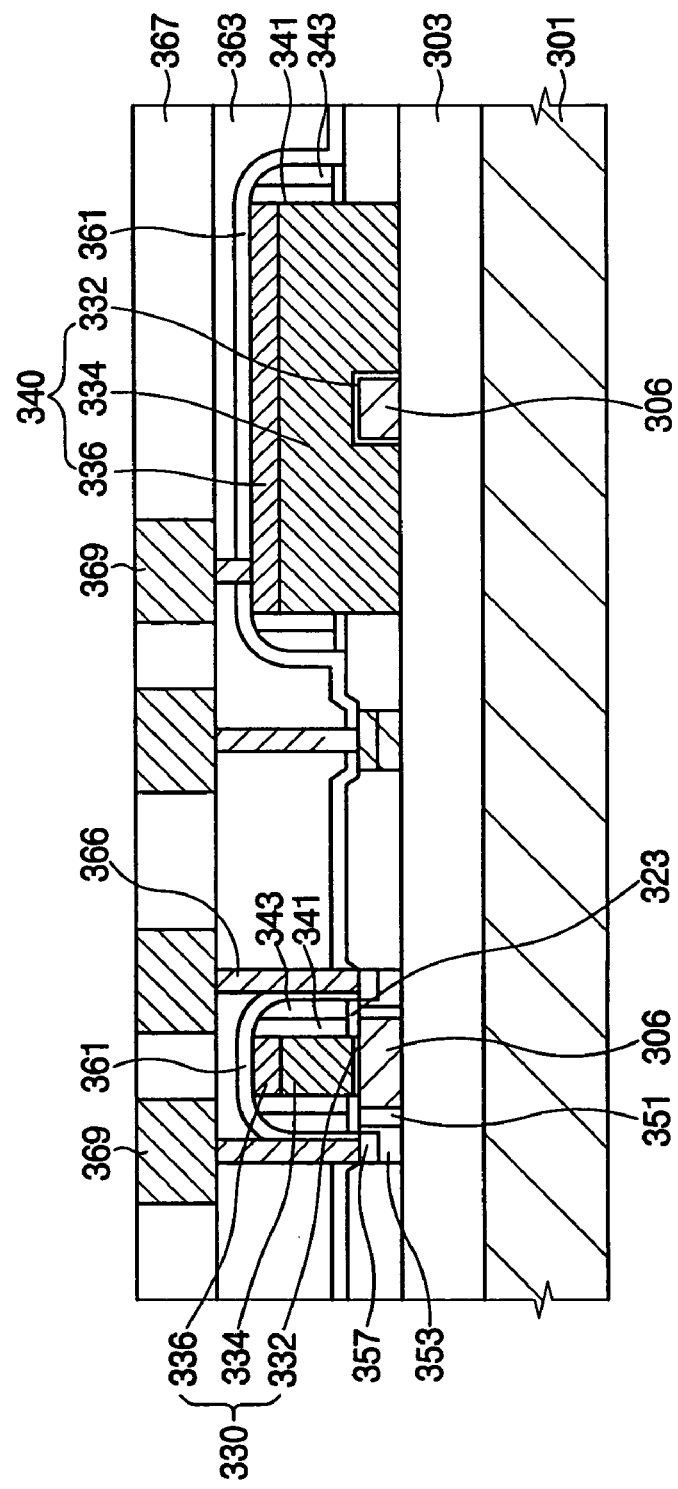

Referring to FIG. 8D, after a first insulating interlayer 363 is formed on the SOI substrate to cover the gate structures 330 and 340, contact plugs 366 contacting the source/drain regions 353 are formed through the first insulating interlayer 363. A protection layer 361 may be selectively formed to cover the gate structures 330 and 340 before forming the first insulating interlayer 363.

A second insulating interlayer 367 is formed on the first insulating interlayer 363, and then wirings 369 connected to the contact plugs 366 are formed through the second insulating interlayer 367. Therefore, the semiconductor device including the triple gate transistor is completed.

FIGS. 9A to 9D are cross-sectional views illustrating a method of manufacturing a semiconductor device including a triple gate transistor in accordance with another embodiment of the present invention.

Figure 9A:
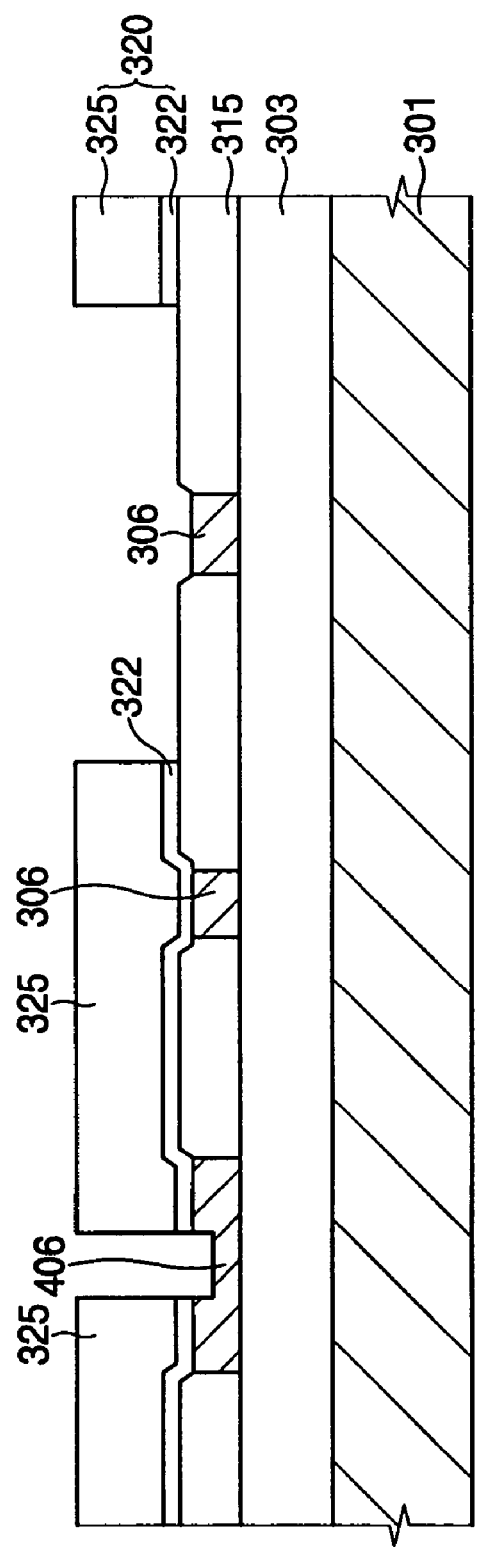
FIGS. 9A to 9D are schematic cross-sectional views illustrating a method of manufacturing a semiconductor device including a triple gate transistor in accordance with one embodiment of the present invention.

Referring to FIG. 9A, an isolation layer 315, active regions 306 and 406 and an etching mask 320 are formed on a substrate including a lower semiconductor layer 301 and a buried insulation layer 303 by processes substantially identical to the processes described with reference to FIG. 8A.

The etching mask 320 includes a silicidation prevention layer pattern 322 and an oxide layer pattern 325 that partially and fully expose the active regions 306 and 406. Additionally, the etching mask 320 completely covers one active region 306.

A recess is formed at the partially exposed active region 406 using the etching mask 320. When the partially exposed active region 406 has the recess, thin channel regions and thick source/drain regions may be achieved to thereby form a semiconductor device including a triple gate transistor that has improved electrical characteristics.

Figure 9B:
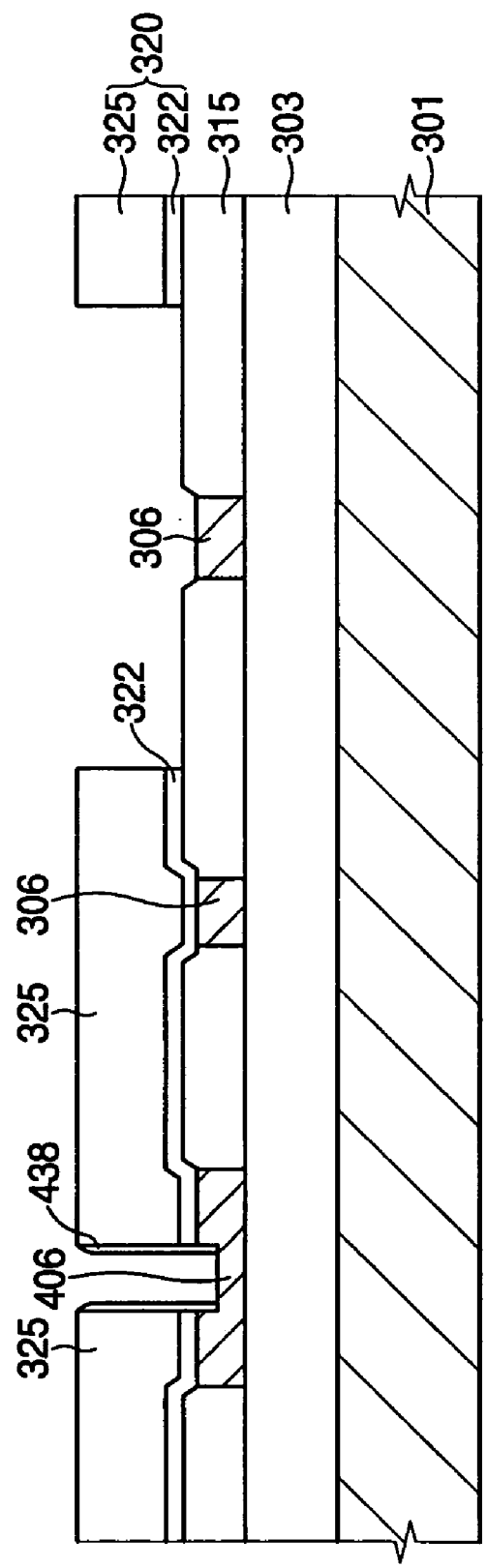

Referring to FIG. 9B, an additional gate spacer 438 may be formed from a sidewall of the recess of the partially exposed active region 406 to a sidewall of the etching mask 320. That is, the additional gate spacer 438 may be formed on the sidewall of the recess, on a sidewall of the silicidation prevention layer pattern 322 and on a sidewall of the oxide layer pattern 325. The additional gate spacer 438 may be formed using dielectric material such as oxide or nitride. When the additional spacer 438 is formed, the semiconductor device including the triple gate transistor may have reduced gate overlap capacitance.

Figure 9C:
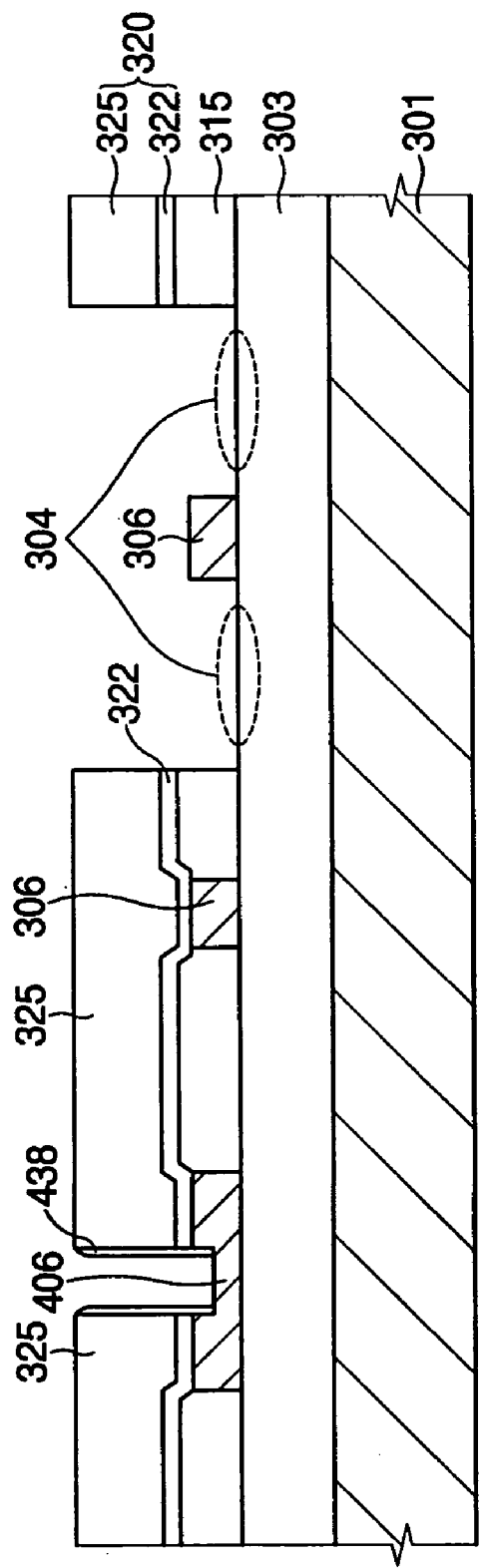

Referring to FIG. 9C, a portion of the isolation layer 315 around the fully exposed active region 306 is removed so that a portion 304 of the buried insulation layer 303 around the fully exposed active region 306 is exposed. The isolation layer 315 is partially etched without damage to the portion 304 of the buried insulation layer 303. Additionally, when the isolation layer 315 is partially etched, the oxide layer pattern 325 is partially etched at the same time. Thus, the oxide layer pattern 325 is properly controlled to have sufficient thickness so that the oxide layer pattern 325 remains on the isolation layer 315 and on the active regions 306, whereas the portion 304 of the buried insulation layer 303 is exposed.

Figure 9D:
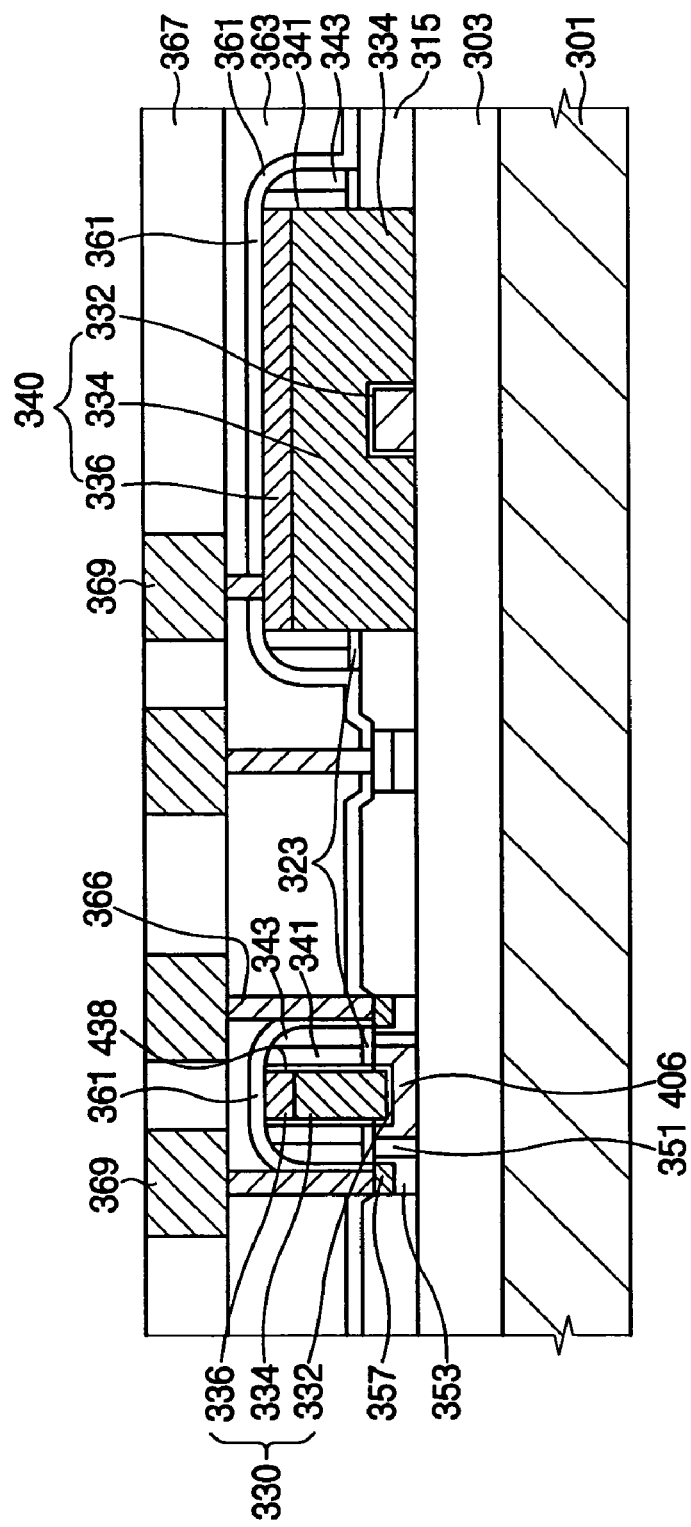

Referring to FIG. 9D, after forming gate structures 330 and 340 on the partially and fully exposed active regions 406 and 306, gate spacers 343 are formed on sidewalls of the gate structures 330 and 340. One gate structure 340 positioned on the exposed portion 304 of the buried insulation layer 303 encloses the fully exposed active region 306. Another gate structure 330 formed on the partially exposed active region 406 includes a gate oxide layer pattern 332, a gate conductive pattern 334 and a silicidation layer 336. One gate structure 340 enclosing the fully exposed active region 306 includes a gate oxide layer pattern 332, a gate conductive pattern 334 and a silicidation layer 336.

Offset spacers 341 may be formed on the sidewalls of the gate structures 330 and 340 before forming the gate spacers 343. Additionally, source/drain extension regions 351 may be formed by implanting impurities into portions of the active regions 406 using the offset spacer 341 as a mask.

Source/drain regions 353 are formed at portions of the active regions 406 adjacent to the gate structure 330 by implanting impurities using the gate spacer 343 as a mask. Portions of the silicidation prevention layer pattern 322 may be removed to form silicidation prevention patterns 323 that expose the source/drain regions 353 and the isolation layer 315. Then, silicidation layers 357 and 336 may be formed at the exposed portions of the source/drain regions 353 and the gate conductive patterns 334 by a silicidation process.

After a first insulating interlayer 363 is formed on the SOI substrate to cover the gate structures 330 and 340, contact plugs 366 contacting the source/drain regions 353 are formed through the first insulating interlayer 363. A protection layer 361 may be formed to cover the gate structures 330 and 340 before forming the first insulating interlayer 363. A second insulating interlayer 367 is formed on the first insulating interlayer 363, and then wirings 369 connected to the contact plugs 366 are formed through the second insulating interlayer 367. Therefore, the semiconductor device including the transistor is formed on the substrate.

FIGS. 10A to 10F are cross-sectional views illustrating a method of manufacturing a semiconductor device including a triple gate transistor in accordance with another embodiment of the present invention.

Figure 10A:
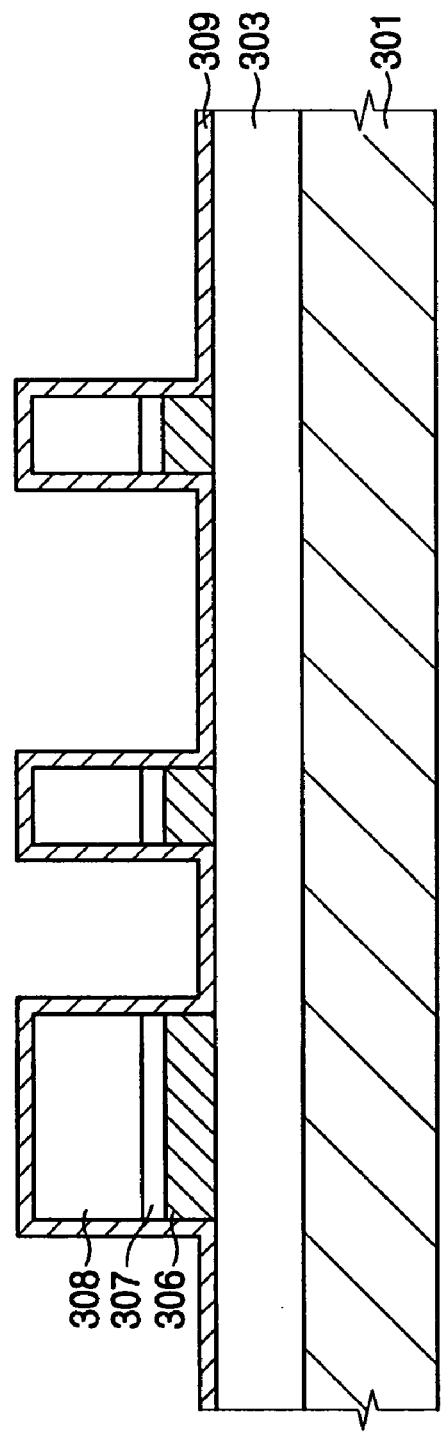
FIGS. 10A to 10F are schematic cross-sectional views illustrating a method of manufacturing a semiconductor device in accordance with one embodiment of the present invention.

Referring to FIG. 10A, there is provided a substrate including a lower semiconductor layer 301, a buried insulation layer 303 and upper semiconductor layer patterns 305. Additional oxide layer patterns 307 and silicon nitride layer patterns 308 are successively formed on the upper semiconductor layer patterns 305, respectively.

An etching stop layer 309 is formed on the buried insulation layer 303 to cover the resultant structures on the buried insulation layer 303. The etching stop layer 309 may include silicon nitride to identify an etching end point in a subsequent etching process.

Figure 10B:
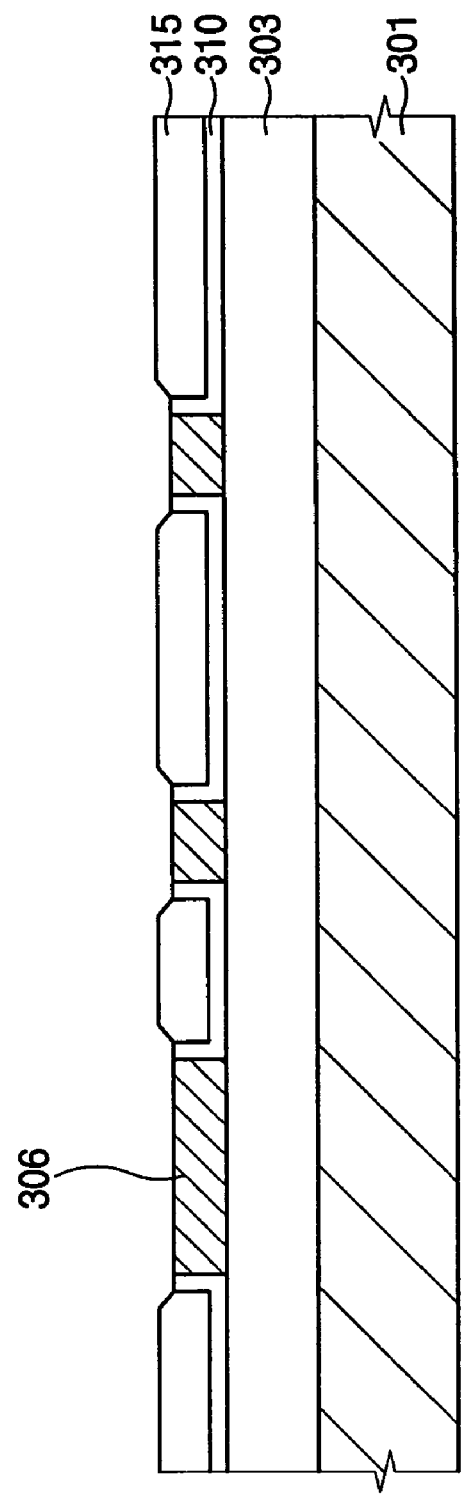

Referring to FIG. 10B, active regions 306 are defined on the buried insulation layer 303 by forming etch stop layer patterns 310 and an isolation layer 315 on the buried insulation layer 303 and on the upper semiconductor layer patterns 305. Particularly, a first oxide layer is formed on the etching stop layer 309. The first oxide layer is partially etched until portions of the etching stop layer 309 on the silicon nitride layer patterns 308 are exposed. The silicon nitride layer patterns 308, the additional oxide layer patterns 307, portions of the etching layer 309 and portions of the first oxide layer are etched until the upper semiconductor layer patterns 305 are exposed. Hence, the active regions 306 defined by the isolation layer 315 are formed on the buried insulation layer 303, and etching stop layer patterns 310 are formed on the buried insulation layer 303 and on sidewalls of the active regions 306. Additionally, the isolation layer 315 is formed to cover the etching stop layer patterns 310.

Figure 10C:
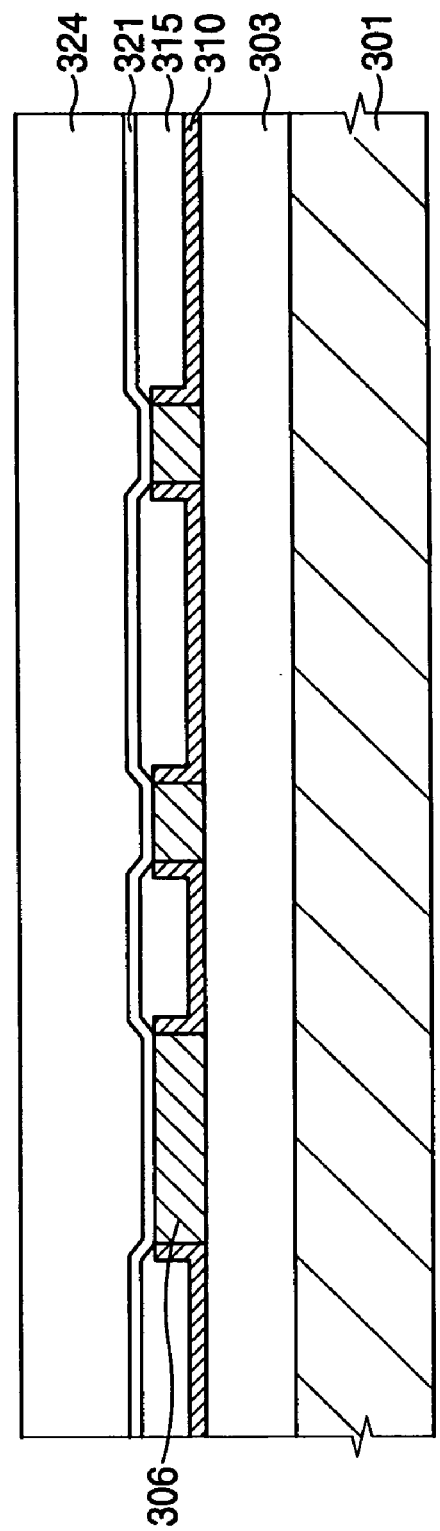

Referring to FIG. 10C, a silicidation prevention layer 321 is formed on the active regions 306 and on the isolation layer 315. The silicidation prevention layer 321 may be formed using silicon nitride.

A second oxide layer 324 is formed on the silicidation prevention layer 321. The second oxide layer 324 may be planarized by a CMP process, an etch back process or a combination process of a CMP and an etch back.

Figure 10D:
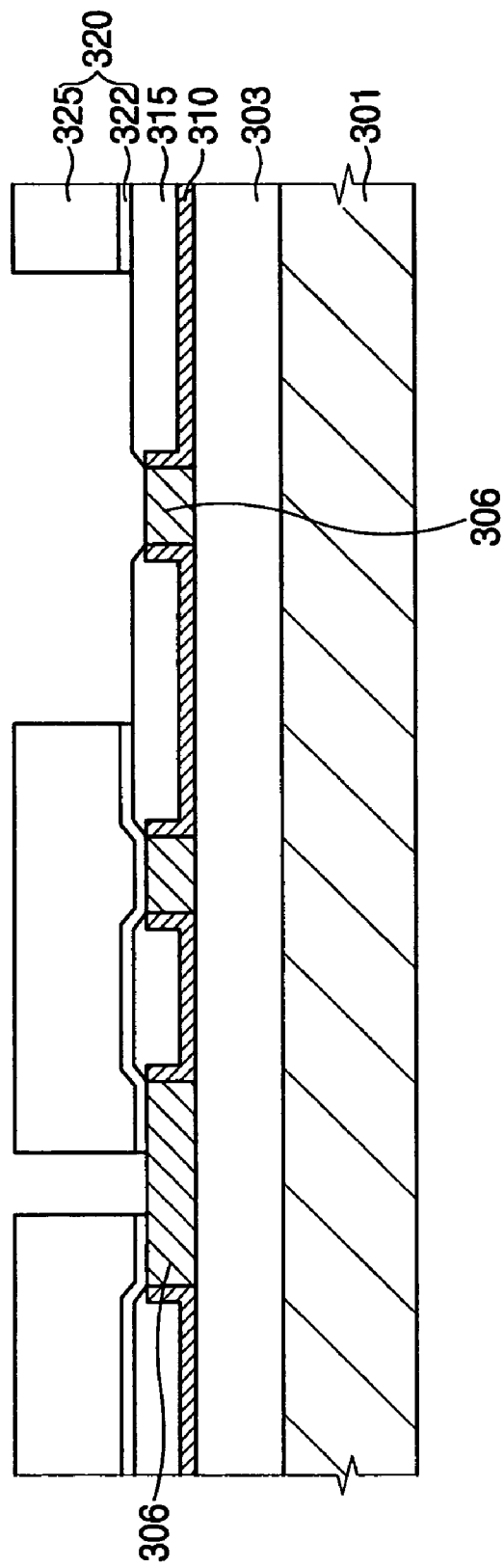

Referring to FIG. 10D, the second oxide layer 324 and the silicidation prevention layer 321 are partially etched to form an etching mask 320 on the isolation layer 315 and on the active regions 306. The etching mask 320 includes a second oxide layer pattern 325 and a silicidation prevention layer pattern 322, which partially and fully expose the active regions 306. Additionally, the etching mask 320 completely covers one of the active regions 306. Here, a portion of the isolation layer 315 around the fully exposed active region 306 is exposed through the etching mask 320.

Figure 10E:
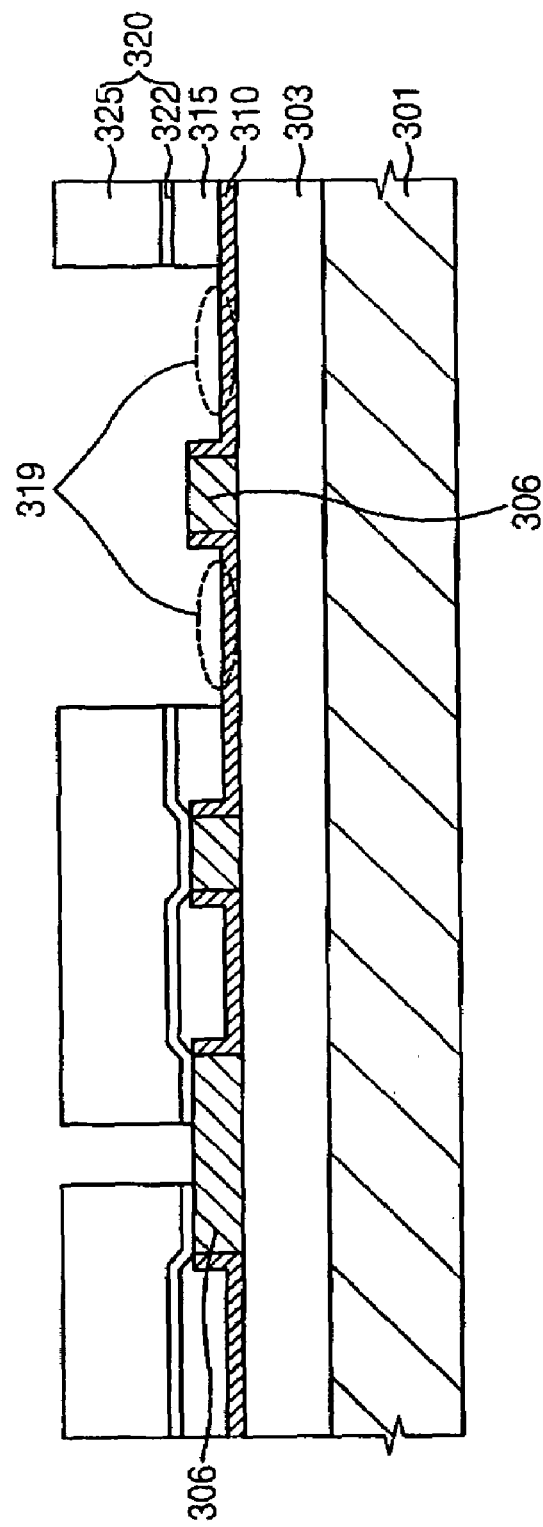

Referring to FIG. 10E, the exposed portion of the isolation layer 315 around the fully exposed active region 306 is removed using the etching mask 320 to thereby expose a portion 319 of the etching stop layer patterns 310 around the fully exposed active regions 306. The exposed portion 319 of the etching stop layer patterns 310 prevent the buried insulation layer 303 from being damaged in the etching of the isolation layer 315.

Figure 10F:
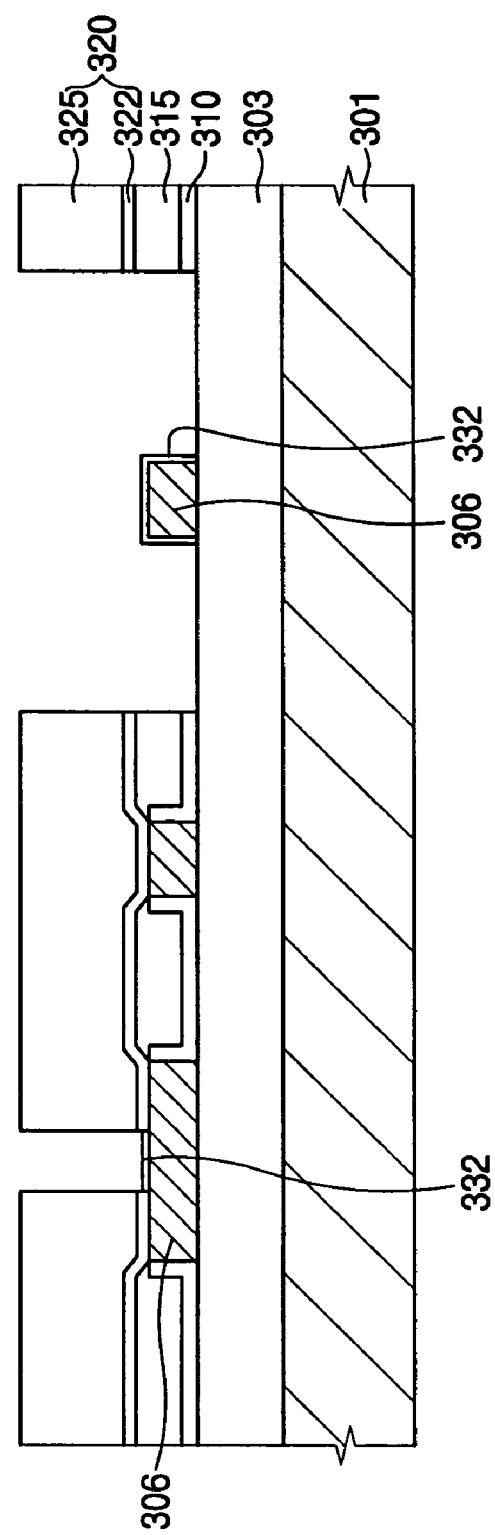

Referring to FIG. 10F, the exposed portion 319 of the etching stop layer patterns 310 is removed to expose a portion of the buried insulation layer 303 around the fully exposed active region 306. Then, gate oxide layer patterns 332 are formed on the active regions 306. One gate oxide layer pattern 332 is formed on partially exposed active region 306, whereas another gate oxide layer pattern 332 is formed to enclose the fully exposed active region 306. A semiconductor device including the triple gate transistor is formed on the substrate according to processes substantially identical to the processes described with reference to FIGS. 8C and 8D.

Figure 11A:
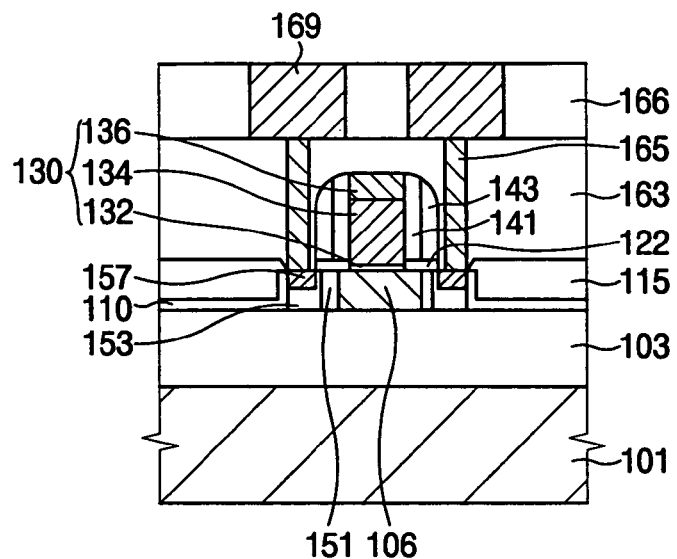
FIG. 11A is a schematic cross-sectional view illustrating a semiconductor device in accordance with one embodiment of the present invention.

FIG. 11A is a cross-sectional view illustrating a semiconductor device in accordance with another one embodiment of the present invention.

Referring to FIG. 11A, a semiconductor device of the present embodiment includes a substrate 100, a gate structure 130, a silicidation prevention pattern 122 and a gate spacer 143.

The substrate 100 may include a silicon substrate or an SOI substrate. The substrate 100 includes a lower semiconductor layer 101, a buried insulation layer 103 formed on the lower semiconductor substrate 101, and an upper semiconductor layer pattern (that is, an active region 106) formed on the buried insulation layer 103. The lower semiconductor layer 101 may include a silicon layer, and the buried insulation layer 103 may include a buried oxide layer. For example, the buried insulation layer 103 has a thickness of about 150 nm, and the upper semiconductor layer pattern has a thickness of about 40 nm. The upper semiconductor layer pattern may include a single crystalline silicon layer. When the SOI substrate is employed for the semiconductor device including a transistor, circuit units are separated from one another by the buried insulation layer 103. Therefore, latch up of the transistor included in the semiconductor device may be avoided, and also a parasite capacitance of the semiconductor device may be reduced. In addition, the semiconductor device may have rapid response speed and low power consumption when the semiconductor device is formed using the SOI substrate in comparison with a bulk silicon substrate.

The semiconductor device of the present embodiment includes an etching stop layer pattern 110 and an isolation layer 115 to define the active region 106. The etching stop layer pattern 110 is formed on the buried insulation layer 103 and on a sidewall of the active region 106. The isolation layer 115 is formed on the etching stop layer pattern 110 to enclose the active region 106. The isolation layer 115 has a thickness slightly thicker than that of the active region 106 so as to prevent silicidation of a sidewall of the active region 106 in a subsequent silicidation process.

The semiconductor device of the present embodiment further includes source/drain regions 153 formed in the active region 106, and silicide layers 157 formed on the source/drain regions 153. The semiconductor device may include source/drain extension regions 151 between the source/drain regions 153 and the active region 106.

The gate structure 130 of the semiconductor device includes a gate insulation layer pattern 132 and a gate conductive pattern 134. The gate insulation layer pattern 132 may include oxide, nitride or oxynitride. The gate conductive pattern 134 may include conductive material such as polysilicon or metal. The gate structure 130 may further include a gate silicide pattern 136 when the gate conductive pattern 134 includes polysilicon.

The gate structure 130 further includes a gate spacer 143 formed on a sidewall of the gate structure 130. An offset spacer 141 may be formed between the sidewall of the gate structure 130 and the gate spacer 143. Additionally, source/drain extension regions 151 may be formed between the active region and the source/drain regions 153, respectively.

The semiconductor device of the present embodiment includes a silicidation prevention pattern 122 that covers a portion of the active region 106, the source/drain extension regions 151, and portions of the source/drain regions 153. The silicidation prevention pattern 122 is positioned beneath the gate and offset spacers 143 and 141. Here, the gate spacer 143 may be formed using a material that has etching selectivity relative to the silicidation prevention pattern 122. For example, the gate spacer 143 is formed using oxide, nitride or oxynitride. The silicidation prevention pattern 122 prevents the isolation layer 115 from being damaged in a wet or a dry etching process. Because the undamaged isolation layer 115 effectively protects a sidewall of the active region 106, silicidation of the sidewall of the active region 106 may be prevented.

In one embodiment of the present invention, a silicon oxide layer may be formed before forming the silicidation prevention pattern 122. When the silicidation prevention pattern 122 is formed using silicon nitride, the silicon oxide layer serves as a buffer layer for reducing stress generated in the silicidation prevention pattern 122. For example, the silicon oxide layer may be formed by a CVD process. On the other hand, the stress generated in the silicidation prevention pattern 122 may be utilized for improving performance of the semiconductor device having the transistor. For example, when the silicidation prevention pattern 122 is formed using thermally deposited silicon nitride, tensile stress may be generated in the silicidation prevention pattern 122 so that electron mobility of an N-MOS transistor may be enhanced to improve electrical characteristics of the N-MOS transistor. When the silicidation prevention pattern 122 is formed using silicon nitride deposited by a plasma process, compressive stress may be generated in the silicidation prevention pattern 122 so that hole mobility of a P-MOS transistor may be enhanced to thereby improve electrical characteristics of the P-MOS transistor.

The semiconductor device of the present embodiment may include etching stop layer patterns 110 when an etching stop layer is formed on the buried insulation layer 103 as described above.

The semiconductor device of the present embodiment further includes a first insulating interlayer 163 covering the gate structure 130, contact plugs 165 contacting the source/drain regions 153, a second insulating interlayer 166 formed on the first insulating interlayer 163, and a wiring 169 contacting the contact plugs 165.

As shown in FIG. 11A, the active region 106 of the present embodiment does not have a recess thereon. In a silicidation process, the silicide layers 157 are formed on upper portions of the source/drain regions 153 except lateral portions of the source/drain regions 153. Thus, the silicidation layers 157 are uniformly formed on the source/drain regions 153 without silicidation of sidewalls and bottom portions of the source/drain regions 153. As a result, voids or intrusion may be prevented to thereby improve the semiconductor device including the transistor without a failure such as leakage current.

Figure 11B:
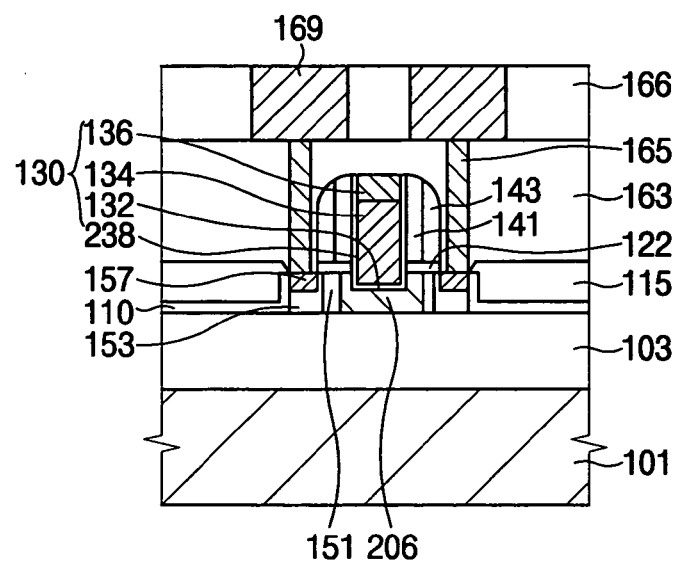
FIG. 11B is a schematic cross-sectional view illustrating a semiconductor device in accordance with one embodiment of the present invention.

FIG. 11B is a cross-sectional view illustrating a semiconductor device in accordance with another embodiment of the present invention.

Referring to FIG. 11B, a semiconductor device of the present embodiment includes a recess formed at a central portion of an active region 206 defined by an isolation layer 115. A gate structure 130 is formed on the recess of the active region 206.

The semiconductor device of the present invention may include an offset spacer 141 and an additional gate spacer 238. The gate spacer 238 may be formed using dielectric material such as oxide. The offset spacer 141 is interposed between a gate spacer 143 and a gate conductive pattern 134. The additional gate spacer 238 is formed between the gate conductive pattern 134 and the offset spacer 141.

In the present embodiment, other elements of the semiconductor device are substantially identical to those of the semiconductor device shown in FIG. 11A. Since the semiconductor device of the present invention includes a triple gate transistor that has relatively thin channel regions and relatively thick source/drain regions 153, the semiconductor device may have improved electrical characteristics without silicidation of a sidewall of the active region 206.

Figure 12A:
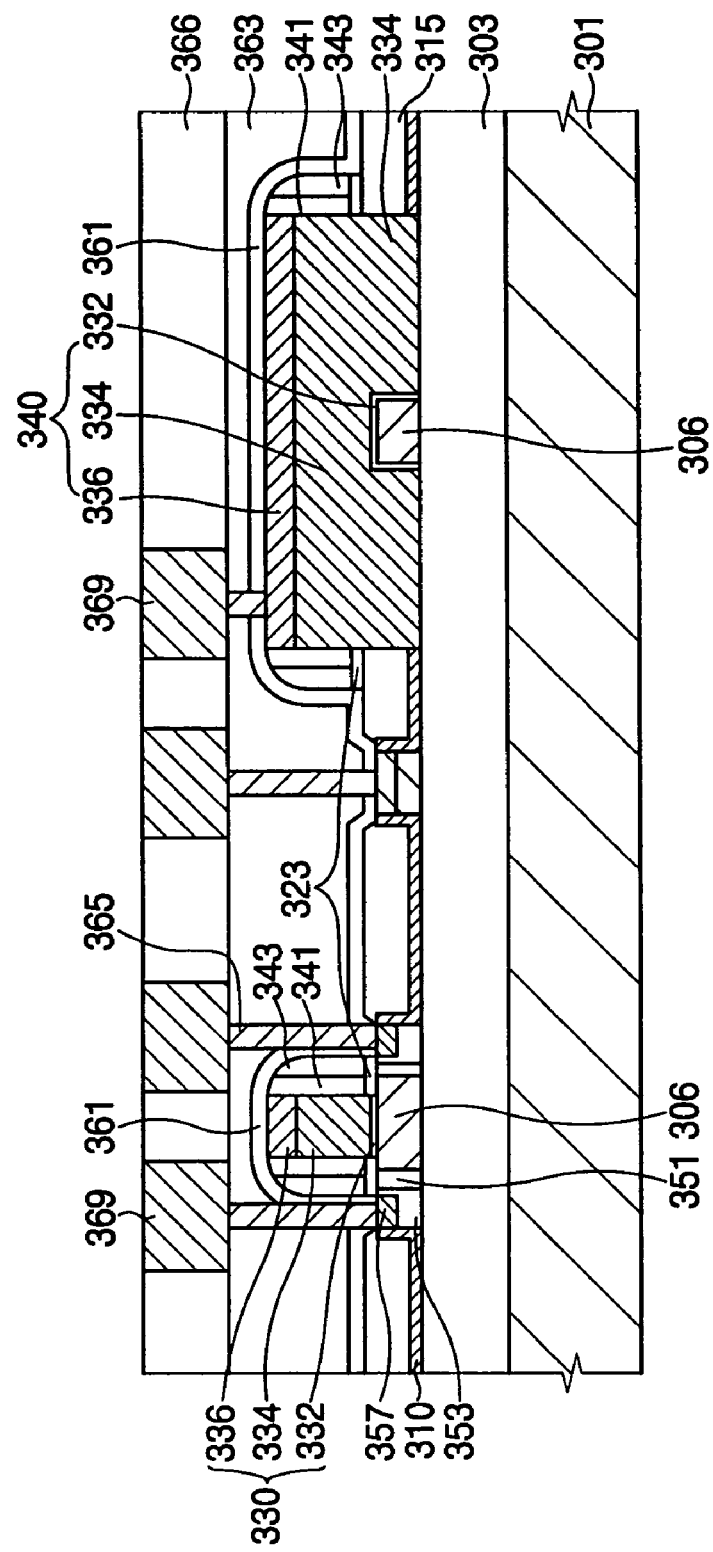
FIG. 12A is a schematic cross-sectional view illustrating a semiconductor device including a triple gate transistor in accordance with one embodiment of the present invention.

FIG. 12A is a cross-sectional view illustrating a semiconductor device including a triple gate transistor in accordance with one embodiment of the present invention.

Referring to FIG. 12A, a semiconductor device of the present embodiment includes an SOI substrate. The SOI substrate has a lower semiconductor layer 301, a buried insulation layer 303 and upper semiconductor layer patterns corresponding to active regions 306. The active regions 306 are defined on the buried insulation layer 303 by an isolation layer 315. Etching stop layer patterns 310 may be formed between the isolation layer 315 and the buried insulation layer 303. In addition, the etching stop layer patterns 310 may enclose sidewalls of the active regions 306. Source/drain regions 353 are formed at portions of the active region 306. Source/drain extension regions 351 may be formed between the source/drain region 353 and the active region 306.

The semiconductor device of the present embodiment includes gate structures 330 and 340 formed on the active regions 306, respectively. One gate structure 330 is formed on one active region 306 whereas another gate structure 340 is formed to enclose another active region 306. Each of the gate structures 330 and 340 includes a gate insulation layer pattern 332, a gate conductive pattern 334 and silicide layer 336. A protection layer 361 may be formed on the SOI substrate to cover the gate structures 330 and 340.

Gate spacers 343 are formed on sidewalls of the gate structures 330 and 340. Offset spacers 341 may be interposed between the gate spacers 343 and the sidewalls of the gate structures 330 and 340, respectively.

The semiconductor device of the present embodiment includes silicidation prevention patterns 323 formed beneath the gate spacer 341 and the offset spacer 343. The silicidation prevention patterns 323 cover the source/drain extension regions 351, portions of the active region 306 and portions of the source/drain regions 351. The silicide layers 357 are also formed on the source/drain regions 353. The silicidation prevention patterns 323 prevent the isolation layer 315 from being damaged in an etching process such as a wet etching or a dry etching process. A silicon oxide layer may be formed before forming the silicidation prevention patterns 323 so as to reduce stress generated in the silicidation prevention patterns 323.

The semiconductor device including a triple gate transistor further has a first insulating interlayer 363 covering the resultant structures formed on the SOI substrate, contact plugs 365 contacting the source/drain regions 353, a second insulating interlayer 366 formed on the first insulating interlayer 363, and a metal wiring 369 electrically connected to the contact plugs 365.

Figure 12B:
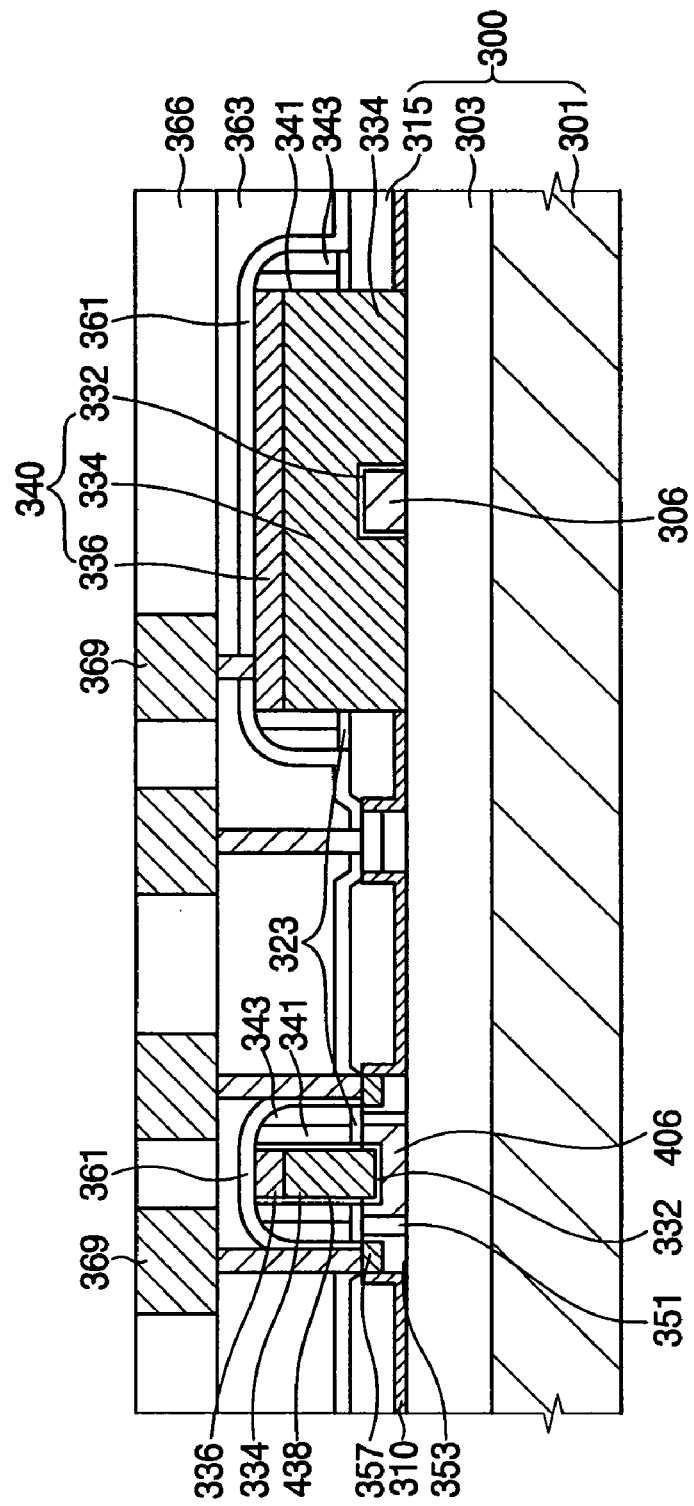
FIG. 12B is schematic cross-sectional view illustrating a semiconductor device including a triple gate transistor in accordance with one embodiment of the present invention.

FIG. 12B is a cross-sectional view illustrating a semiconductor device including a triple gate transistor in accordance with another embodiment of the present invention.

Referring to FIG. 12B, a semiconductor device of the present embodiment includes an SOI substrate. The SOI substrate has a lower semiconductor layer 301, a buried insulation layer 303 and upper semiconductor layer patterns corresponding to active regions 306. The active regions 306 are defined on the buried insulation layer 303 by an isolation layer 315. Etching stop layer patterns 310 may be formed between the isolation layer 315 and the buried insulation layer 303. Additionally, the etching stop layer patterns 310 may enclose sidewalls of the active regions 306. Source/drain regions 353 are formed at portions of the active region 306. Source/drain extension regions 351 may be formed between the source/drain regions 353 and the active region 306.

The semiconductor device of the present embodiment includes gate structures 330 and 340 formed on the active regions 306, respectively. One gate structure 330 is formed on a recess of one active region 306, and another gate structure 340 is formed to enclose another active region 306. The gate structures 330 and 340 include gate insulation layer patterns 332, gate conductive patterns 334 and silicide layers 336, respectively. The gate structures 330 on the recess of the active region 306 may include an additional gate spacer 438 formed on a sidewall of the gate conductive pattern 334. A protection layer 361 may be formed on the SOI substrate to cover the gate structures 330 and 340.

Gate spacers 343 are formed on sidewalls of the gate structures 330 and 340. Offset spacers 341 may be interposed between the gate spacers 343 and the sidewall of the gate structures 330 and 340, respectively.

The semiconductor device of the present embodiment includes silicidation prevention patterns 323 formed beneath the gate spacer 341 and the offset spacer 343. The silicidation prevention patterns 323 cover the source/drain extension regions 351, portions of the active region 306 and portions of the source/drain regions 351. The silicide layers 357 are also formed on the source/drain regions 353. The silicidation prevention patterns 323 prevent the isolation layer 315 from being damaged in an etching process such as a wet etching or a dry etching process. The semiconductor device includes a triple gate transistor that has thin channel regions and thick source/drain regions 353 to thereby improve electrical characteristics thereof. Other elements of the semiconductor device of the present embodiment are substantially identical to those of the semiconductor device shown in FIG. 12A.

According to the present invention, a semiconductor device may include a triple gate transistor that has improved electrical characteristics without generation of voids and intrusion thereof. Thus, the semiconductor device including the triple gate transistor may have enhanced performance and reliability. Additionally, a failure such as thermal budget of the semiconductor device may be prevented in a step of forming silicidation prevention patterns of the semiconductor device because the silicidation prevention patterns are formed before forming source/drain regions of the semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device comprising:
   forming a substrate including an active region defined by an isolation layer, the isolation layer being thicker than the active region such that the upper surface of the isolation layer is above the upper surface of the active region;
   forming an etching mask on the isolation layer and the active region, the etching mask including a silicidation prevention pattern that exposes a portion of the active region;
   forming a gate structure on the exposed portion of the active region;
   forming a gate spacer on the silicidation prevention pattern and a sidewall of the gate structure; and
   forming source/drain regions on the active region using the gate spacer as a mask.

2. The method of manufacturing a semiconductor device of claim 1, wherein forming the substrate further comprises:
   forming a silicon nitride layer on a silicon on insulator (SOI) substrate including a lower semiconductor layer, a buried insulation layer and an upper semiconductor layer;
   forming the active region by at least partially etching the silicon nitride layer and the upper semiconductor layer;
   forming a first oxide layer on the SOI substrate to cover the active region;
   exposing the silicon nitride layer pattern by at least partially etching the first oxide layer; and
   forming the isolation layer by removing the silicon nitride layer.

3. The method of manufacturing a semiconductor device of claim 2, further comprising forming an additional oxide layer on the SOI substrate before forming the silicon nitride layer, wherein the active region is formed by at least partially etching the silicon nitride layer, the additional oxide layer and the upper semiconductor layer, and the isolation layer is formed by removing the silicon nitride layer and the additional oxide layer.

4. The method of manufacturing a semiconductor device of claim 2, wherein the first oxide layer is formed using a high density plasma (HDP) process.

5. The method of manufacturing a semiconductor device of claim 2, wherein at least partially etching the first oxide layer further comprises:
primarily exposing the silicon nitride layer by polishing the first oxide layer using a chemical mechanical polishing (CMP) process; and
secondarily exposing the primarily exposed silicon nitride layer by etching the first oxide layer using a wet etching process with an etching solution including hydrogen fluoride (HF).

6. The method of manufacturing a semiconductor device of claim 2, wherein the silicon nitride layer is removed by a wet etching process using an etching solution including phosphoric acid ($H_3PO_4$).

7. The method of manufacturing a semiconductor device of claim 2, wherein the silicidation prevention pattern is formed by forming a silicidation prevention layer on the substrate including the isolation layer and the active region; forming a second oxide layer on the silicidation prevention layer; etching the second oxide layer to expose a portion of the silicidation prevention layer; and removing the exposed portion of the silicidation prevention layer to form the silicidation prevention pattern at least partially exposing the active region.

8. The method of manufacturing a semiconductor device of claim 1, further comprising forming a silicon oxide pattern on the isolation layer and the active region to at least partially expose the active region before forming the silicidation prevention pattern, wherein the silicidation prevention pattern is formed on the silicon oxide pattern.

9. The method of manufacturing a semiconductor device of claim 1, wherein:
the etching mask further comprises an oxide layer pattern formed on the silicidation prevention pattern; and
forming the gate structure further comprises:
forming a gate conductive layer on the oxide pattern and the exposed portion of the active region;
exposing the oxide layer pattern by at least partially removing the gate conductive layer; and
forming the gate structure by removing the oxide layer pattern.

10. The method of manufacturing a semiconductor device of claim 1, prior to forming the gate spacer, further comprising:
forming an offset spacer on the sidewall of the gate structure; and
forming source/drain extension regions by implanting impurities into portions of the active region using the offset spacer as a mask, wherein the gate spacer is formed on a sidewall of the offset spacer.

11. The method of manufacturing a semiconductor device of claim 1, after forming the source/drain regions, further comprising:
at least partially exposing the source/drain regions and the isolation layer by removing a portion of the silicidation prevention pattern around the gate spacer; and
forming silicidation layers on the source/drain regions.

12. The method of manufacturing a semiconductor device of claim 1, wherein the silicidation layers are formed at surface portions of the source/drain regions.

13. The method of manufacturing a semiconductor device of claim 1, after forming the etching mask, further comprising:
at least partially etching the active region to form a recess on the active region; and
forming an additional gate spacer on a sidewall of the recess of the active region, wherein the gate structure is formed on the recess of the active region.

14. A method of manufacturing a semiconductor device comprising:
forming an SOI substrate including a lower semiconductor layer, a buried insulation layer and an upper semiconductor layer;
forming active regions by at least partially etching the upper semiconductor layer and forming an isolation layer on the buried insulation layer;
forming an etching mask on the isolation layer and the active regions, wherein the etching mask includes a silicidation prevention pattern and a first oxide layer pattern that at least partially and fully exposes the active regions;
exposing a portion of the buried insulation layer around the fully exposed active region by at least partially removing the etching mask;
forming gate structures on the at least partially exposed active region and the fully exposed active region;
forming gate spacers on sidewalls of the gate structures; and
forming source/drain regions on the active regions using the gate spacers as masks.

15. The method of manufacturing a semiconductor device of claim 14, wherein the gate structure encloses the fully exposed active region.

16. The method of manufacturing a semiconductor device of claim 15, wherein channel regions are formed on an upper portion and lateral portions of the active region.

17. The method of manufacturing a semiconductor device of claim 14, after forming the source/drain regions, further comprising:
at least partially exposing the source/drain regions and the isolation layer by at least partially removing the silicidation prevention pattern; and
forming silicidation layers on the exposed source/drain regions.

18. The method of manufacturing a semiconductor device of claim 14, after forming the etching mask, further comprising:
at least partially etching the partially exposed active region using the etching mask; and
forming an additional gate spacer from an etched portion of the active region to a sidewall of the etching mask, wherein the gate structure is positioned on the etched portion of the active region.

19. A method of manufacturing a semiconductor device comprising:
forming a substrate including a semiconductor layer pattern defined by an isolation layer;
forming an etching mask on the isolation layer and the semiconductor layer pattern, wherein the etching mask includes an oxide layer pattern and a silicidation prevention pattern at least partially exposing the semiconductor layer pattern;
forming a three-dimensional active region having a polygonal structure by at least partially etching the oxide layer pattern;
forming a gate structure on the substrate to enclose the active region;
forming a gate spacer on a sidewall of the gate structure; and forming source/drain regions on the active region using the gate spacer as a mask.

20. The method of manufacturing a semiconductor device of claim 19, wherein channel regions are formed on an upper portion and lateral portions of the active region.

21. The method of manufacturing a semiconductor device of claim 19, after forming the source/drain regions, further comprising:
at least partially exposing the source/drain regions and the isolation layer by at least partially removing the silicidation prevention pattern; and
forming silicide layers on exposed portions of the source/drain regions.

22. A method of manufacturing a semiconductor device comprising:
forming a substrate including a lower semiconductor layer, a buried insulation layer and upper semiconductor layer patterns;
forming an etching stop layer on the substrate to cover the upper semiconductor layer patterns;
forming active regions on the buried insulation layer by forming an isolation layer on the etching stop layer;
forming an etching mask on the isolation layer and the active regions, wherein the etching mask includes a silicidation prevention pattern and an oxide layer pattern that at least partially and fully exposes the active regions;
exposing a portion of the etching stop layer around the fully exposed active region by at least partially removing the etching mask;
exposing a portion of the buried insulation layer around the fully exposed active region by partially removing the etching stop layer;
forming gate structures on the partially exposed the active region and the fully exposed active region, respectively;
forming gate spacers on sidewalls of the gate structures; and
forming source/drain regions on the active regions using the gate spacer as masks.

23. The method of manufacturing a semiconductor device of claim 22, wherein forming the active regions further comprising:
forming a silicon nitride layer pattern on the etching stop layer;
forming an oxide layer on the etching stop layer to cover the silicon nitride layer pattern;
exposing a portion of the etching stop layer and the silicon nitride layer pattern by at least partially etching the oxide layer; and
forming the active region defined by the isolation layer and the etching stop layer by successively removing the exposed portion of the etching stop layer and the silicon nitride layer pattern.

24. The method of manufacturing a semiconductor device of claim 22, wherein the etching stop layer includes silicon nitride.

25. The method of manufacturing a semiconductor device of claim 22, further comprising successively forming an additional oxide layer pattern and nitride layer pattern on the upper semiconductor layer patterns.

26. A method of manufacturing a semiconductor device comprising:
forming a substrate including an active region defined by an isolation layer;
forming an etching mask on the isolation layer and the active region, the etching mask including a silicidation prevention pattern that exposes a portion of the active region;
forming a gate structure on the exposed portion of the active region;
forming a gate spacer on the silicidation prevention pattern and a sidewall of the gate structure; and
forming source/drain regions on the active region using the gate spacer as a mask;
wherein forming the substrate further comprises:
forming a silicon nitride layer on a silicon on insulator (SOI) substrate including a lower semiconductor layer, a buried insulation layer and an upper semiconductor layer;
forming the active region by at least partially etching the silicon nitride layer and the upper semiconductor layer;
forming a first oxide layer on the SOI substrate to cover the active region;
exposing the silicon nitride layer pattern by at least partially etching the first oxide layer; and
forming the isolation layer by removing the silicon nitride layer;
wherein at least partially etching the first oxide layer further comprises:
primarily exposing the silicon nitride layer by polishing the first oxide layer using a chemical mechanical polishing (CMP) process; and
secondarily exposing the primarily exposed silicon nitride layer by etching the first oxide layer using a wet etching process with an etching solution including hydrogen fluoride (HF).

* * * * *